US006351740B1

(12) United States Patent
Rabinowitz

(10) Patent No.: US 6,351,740 B1
(45) Date of Patent: Feb. 26, 2002

(54) METHOD AND SYSTEM FOR TRAINING DYNAMIC NONLINEAR ADAPTIVE FILTERS WHICH HAVE EMBEDDED MEMORY

(75) Inventor: Matthew Rabinowitz, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 09/201,927

(22) Filed: Dec. 1, 1998

Related U.S. Application Data
(60) Provisional application No. 60/067,490, filed on Dec. 1, 1997.

(51) Int. Cl.[7] .............................................. G06F 15/18
(52) U.S. Cl. ......................................... 706/22; 706/25
(58) Field of Search ..................................... 706/22, 25

(56) References Cited

U.S. PATENT DOCUMENTS

| | | | | |
|---|---|---|---|---|
| 4,843,583 A | * | 6/1989 | White et al. ................. | 708/322 |
| 5,175,678 A | * | 12/1992 | Frerichs et al. ............... | 700/47 |
| 5,272,656 A | * | 12/1993 | Genereux ..................... | 706/22 |
| 5,376,962 A | * | 12/1994 | Zortea .......................... | 706/22 |
| 5,542,054 A | * | 7/1996 | Batten, Jr. .................... | 706/22 |
| 5,548,192 A | * | 8/1996 | Hanks .......................... | 318/560 |
| 5,617,513 A | * | 4/1997 | Schnitta ....................... | 706/22 |
| 5,761,383 A | * | 6/1998 | Engel et al. ................... | 706/22 |
| 5,963,929 A | * | 10/1999 | Lo ............................... | 706/22 |
| 6,064,997 A | * | 5/2000 | Jagannathan et al. .......... | 76/22 |

OTHER PUBLICATIONS

Ong et al, "A Decision Feedback Recurrent Neural Equalizer as an Infinite Impulse Response Filter", IEEE Transactions on Signal Processing, Nov. 1997.*

Rui J. P. de Figueiredo, "Optimal Neural Network Realizations of Nonlinear FIR and IIR Filters" IEEE International Syposium on Circuits and Systems, Jun. 1997.*

Yu et al, "Dynamic Learning Rate Optimization of the Back Propagation Algorithm", IEEE Transactions on Neural Networks, May 1995.*

(List continued on next page.)

*Primary Examiner*—George B. Davis
(74) *Attorney, Agent, or Firm*—Lumen Intellectual Property Services, Inc.

(57) ABSTRACT

Described herein is a method and system for training nonlinear adaptive filters (or neural networks) which have embedded memory. Such memory can arise in a multi-layer finite impulse response (FIR) architecture, or an infinite impulse response (IIR) architecture. We focus on filter architectures with separate linear dynamic components and static nonlinear components. Such filters can be structured so as to restrict their degrees of computational freedom based on a priori knowledge about the dynamic operation to be emulated. The method is detailed for an FIR architecture which consists of linear FIR filters together with nonlinear generalized single layer subnets. For the IIR case, we extend the methodology to a general nonlinear architecture which uses feedback. For these dynamic architectures, we describe how one can apply optimization techniques which make updates closer to the Newton direction than those of a steepest descent method, such as backpropagation. We detail a novel adaptive modified Gauss-Newton optimization technique, which uses an adaptive learning rate to determine both the magnitude and direction of update steps. For a wide range of adaptive filtering applications, the new training algorithm converges faster and to a smaller value of cost than both steepest-descent methods such as backpropagation-through-time, and standard quasi-Newton methods. We apply the algorithm to modeling the inverse of a nonlinear dynamic tracking system 5, as well as a nonlinear amplifier 6.

25 Claims, 15 Drawing Sheets

OTHER PUBLICATIONS

White et al., "The Learning Rate in Back–Proprogation Systems =an Application of Newton's Method", IEEE IJCNN, May 1990.*

Nobakht et al, "Nolinear Adaptive Filtering using Annealed Neural Networks", IEEE International Sympsium on Circuits and Systems, May 1990.*

Pataki, B–, "Neural Network based Dynamic Models," Third International Conference on Artificial Neural Networks, IEEE. 1993*

Dimitri P–Bertsekas, "Incremental Least Squares, Methods and the Extended kalman Filter", IEEE proceedings of the 33rd conference on Decision and control Dec. 1994.*

Puskorius et al, "Multi–Stream Extended Kalman" Filter Training for Static and Dynamic Neural Networks IEEE International conference on System, Man, and Cybernetics– Oct. 1997.*

Back et al, "Internal Representation of Data, in Multilayer Perceptrons with IIR Synapses", proceedings of 1992 I International Conference on Circuits and Systems May 1992.*

Sorensen, O, "Neural Networks Performing System Identification for Control Applications", IEEE Third International Conference on Artificial Neural Networks, 1993.*

Back et al, "A Unifying View of Some Training Algorithm for Multilayer Perceptrons with FIR Filled Synapses", Proceedings of the 1994 IEEEE. Sep. 1994.*

Workshop on Neural Networks for Signal Processing.*

Sorensen, O, "Neural Networks for Non–Linear Control", Proceedings of the Third IEEE Conference on Control Applications, Aug. 1994.*

* cited by examiner

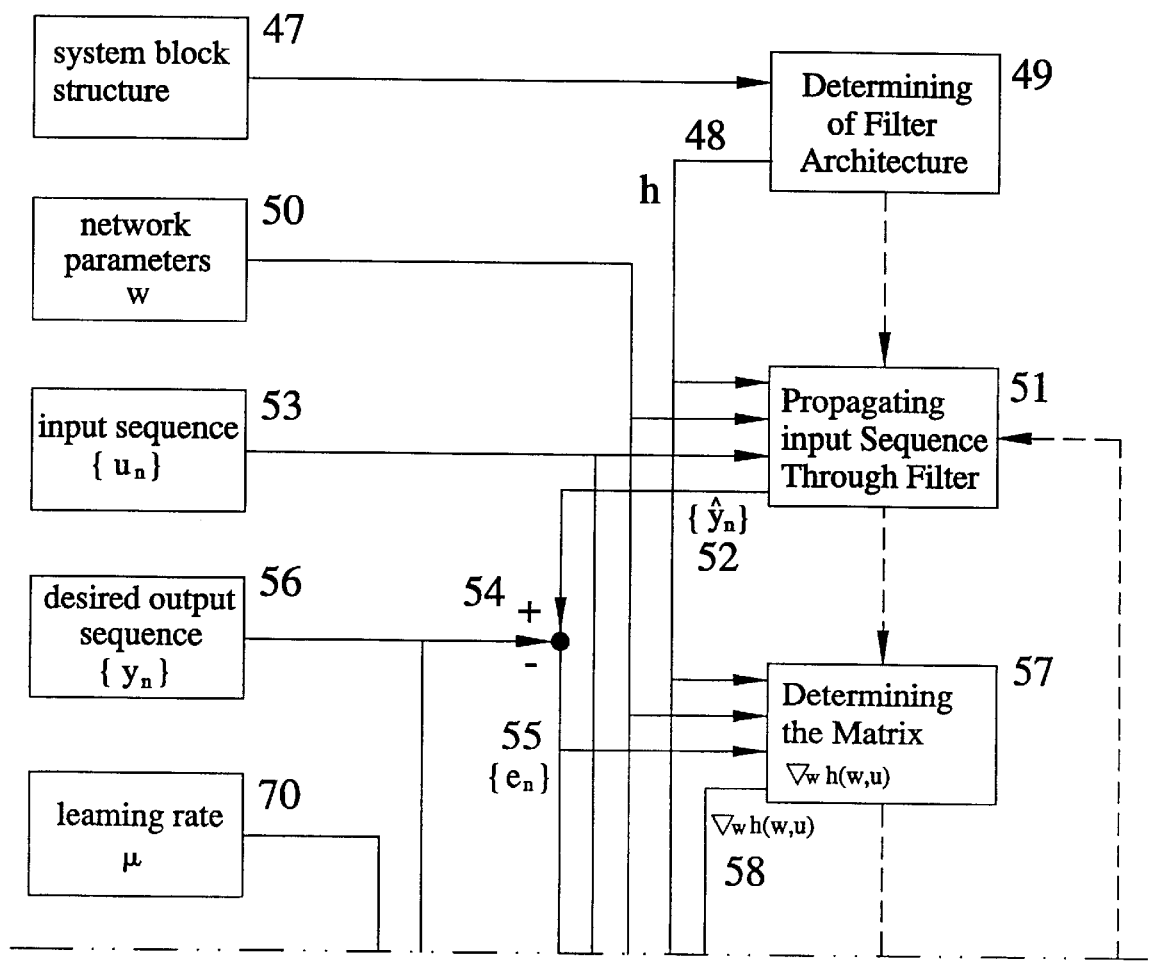

Figure 2B:
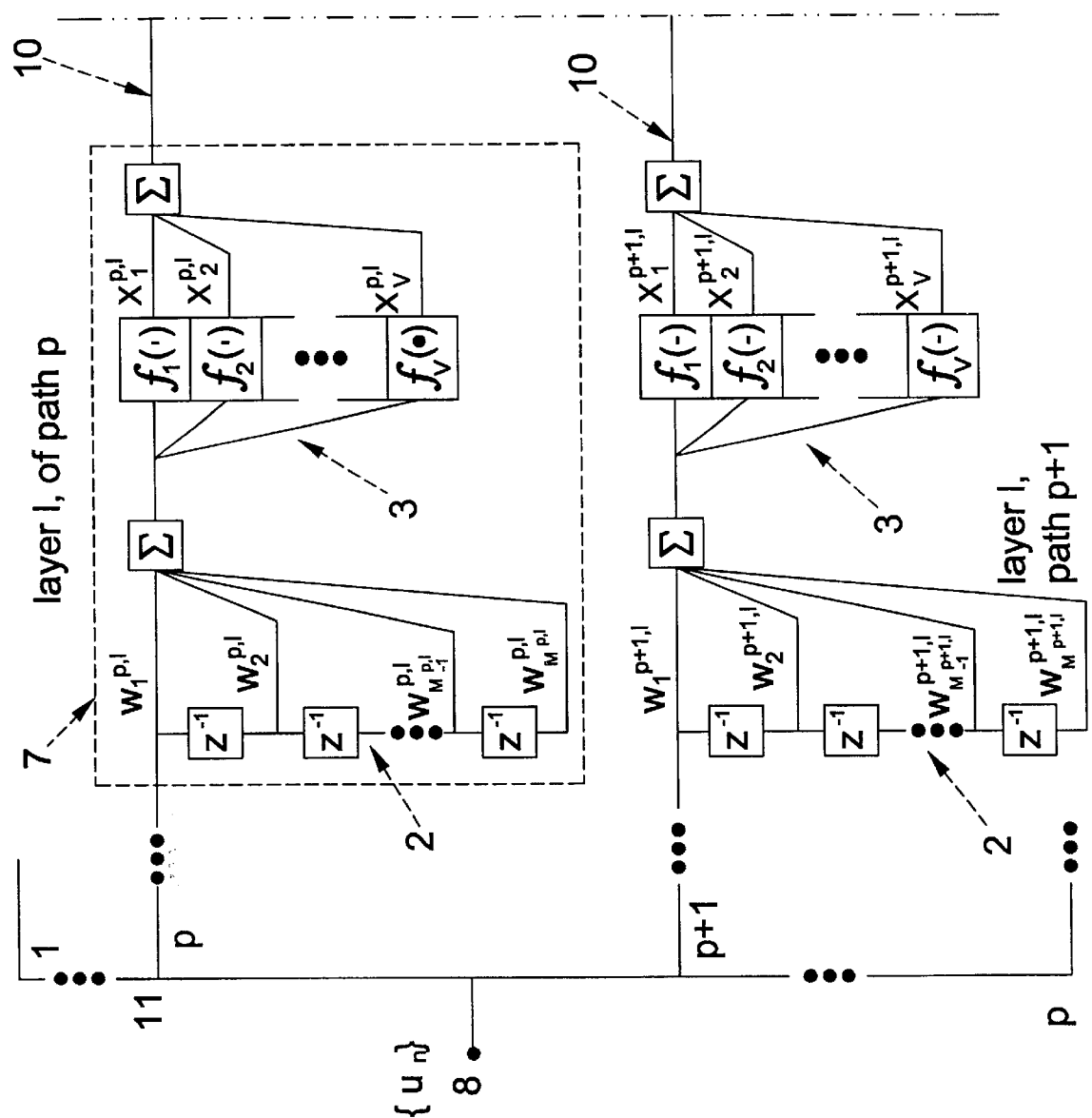

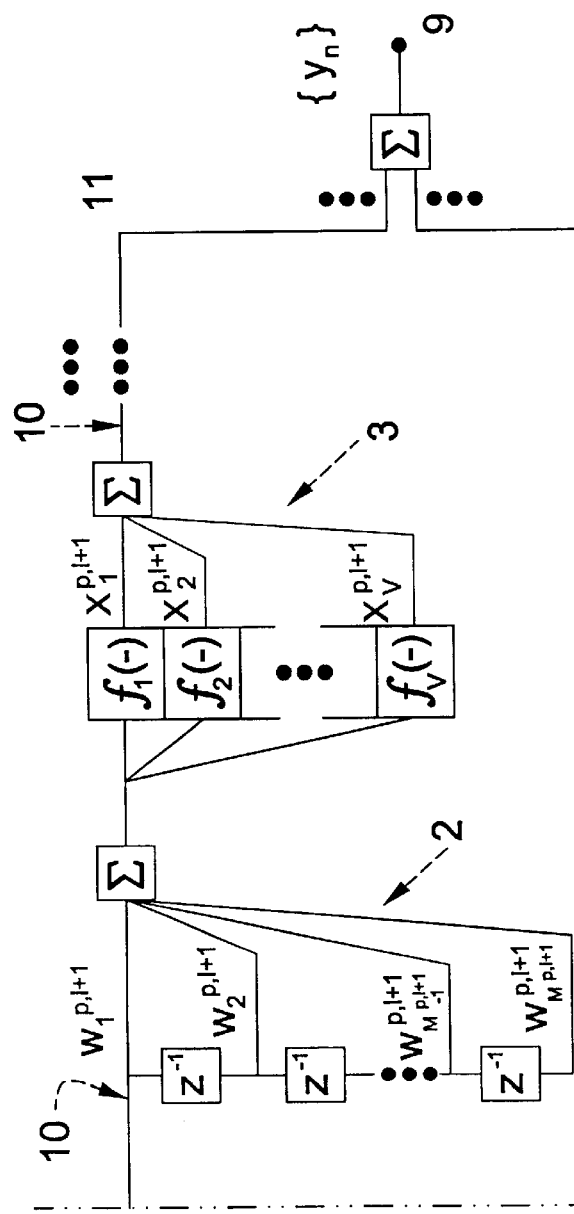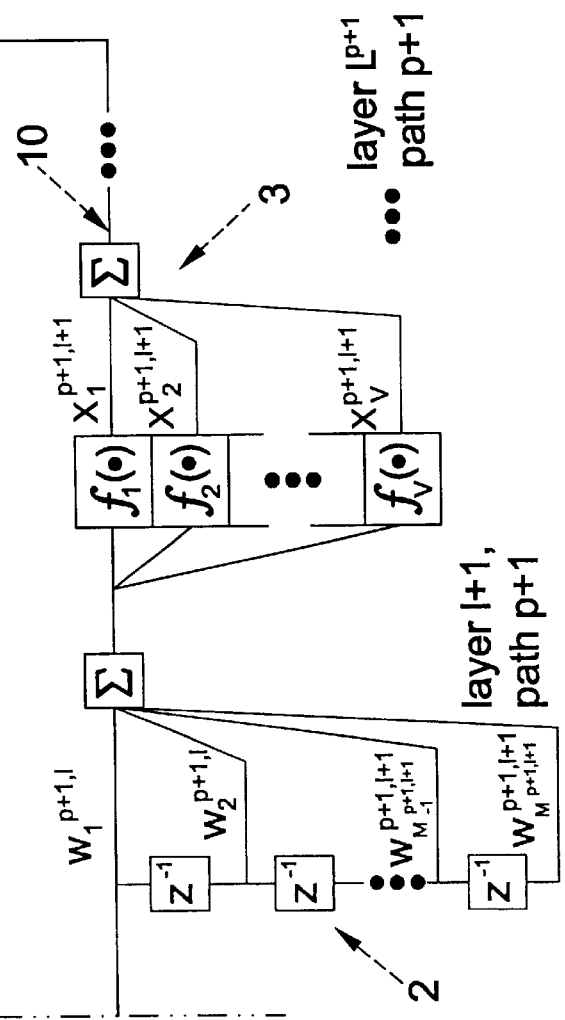
Fig. 2A
Fig. 2
Fig. 2A
Fig. 2B

US 6,351,740 B1

METHOD AND SYSTEM FOR TRAINING DYNAMIC NONLINEAR ADAPTIVE FILTERS WHICH HAVE EMBEDDED MEMORY

I. CROSS-REFERENCE TO RELATED APPLICATIONS

This application claims priority from U.S. Provisional Patent Application No. 60/067,490 filed Dec. 1, 1997, which is incorporated herein by reference.

This invention was reduced to practise with support from NASA under contract NAS8-36125. The U.S. Government has certain rights to the invention.

II. FIELD OF THE INVENTION

This invention relates to neural networks or adaptive nonlinear filters which contain linear dynamics, or memory, embedded within the filter. In particular, this invention describes a new system and method by which such filters can be efficiently trained to process temporal data.

III. BACKGROUND OF THE INVENTION

In problems concerning the emulation, control or post-processing of nonlinear dynamic systems, it is often the case that the exact system dynamics are difficult to model. A typical solution is to train the parameters of a nonlinear filter to perform the desired processing, based on a set of inputs and a set of desired outputs, termed the training signals. Since its discovery in 1985, backpropagation (BP) has emerged as the standard technique for training multi-layer adaptive filters to implement static functions, to operate on tapped-delay line inputs, and in recursive filters where the desired outputs of the filters are known—[1, 2, 3, 4, 5]. The principle of static BP was extended to networks with embedded memory via backpropagation-through-time (BPTT) the principle of which has been used to train network parameters in feedback loops when components in the loop are modeled [6] or un-molded [7]. For the special case of finite impulse response (FIR) filters, of the type discussed in this paper, the BPTT algorithm has been further refined [8]. Like BP, BPTT is a steepest-descent method, but it accounts for the outputs of a layer in a filter continuing to propagate through a network for an extended length of time. Consequently, the algorithm updates network parameters according to the error they produce over the time spanned by the training data. In essence, BP and BPTT are steepest descent algorithms, applied successively to each layer in a nonlinear filter. It has been shown [9] that the steepest descent approach is locally $H^\infty$ optimal in prediction applications where training inputs vary at each weight update, or training epoch. However when the same training data is used for several epochs, BPTT is suboptimal, and techniques which generate updates closer to the Newton update direction (see section 10) are preferable. We will refer to such techniques, which generate updates closer to the Newton update direction, as Newton-like methods.

Since steepest-descent techniques such as BPTT often behave poorly in terms of convergence rates and error minimization, it is therefore an object of this invention to create a method by which Newton-like optimization techniques can be applied to nonlinear adaptive filters containing embedded memory for the purpose of processing temporal data. It is further an object of this invention to create an optimization technique which is better suited to training a FIR or IIR network to process temporal data than classical Newton-like [10] techniques. It is further an object of this invention to create multi-layer adaptive filters which are Taylor made for specific applications, and can be efficiently trained with the novel Newton-like algorithm.

IV. BRIEF DESCRIPTION OF DRAWINGS

Figure 1B:
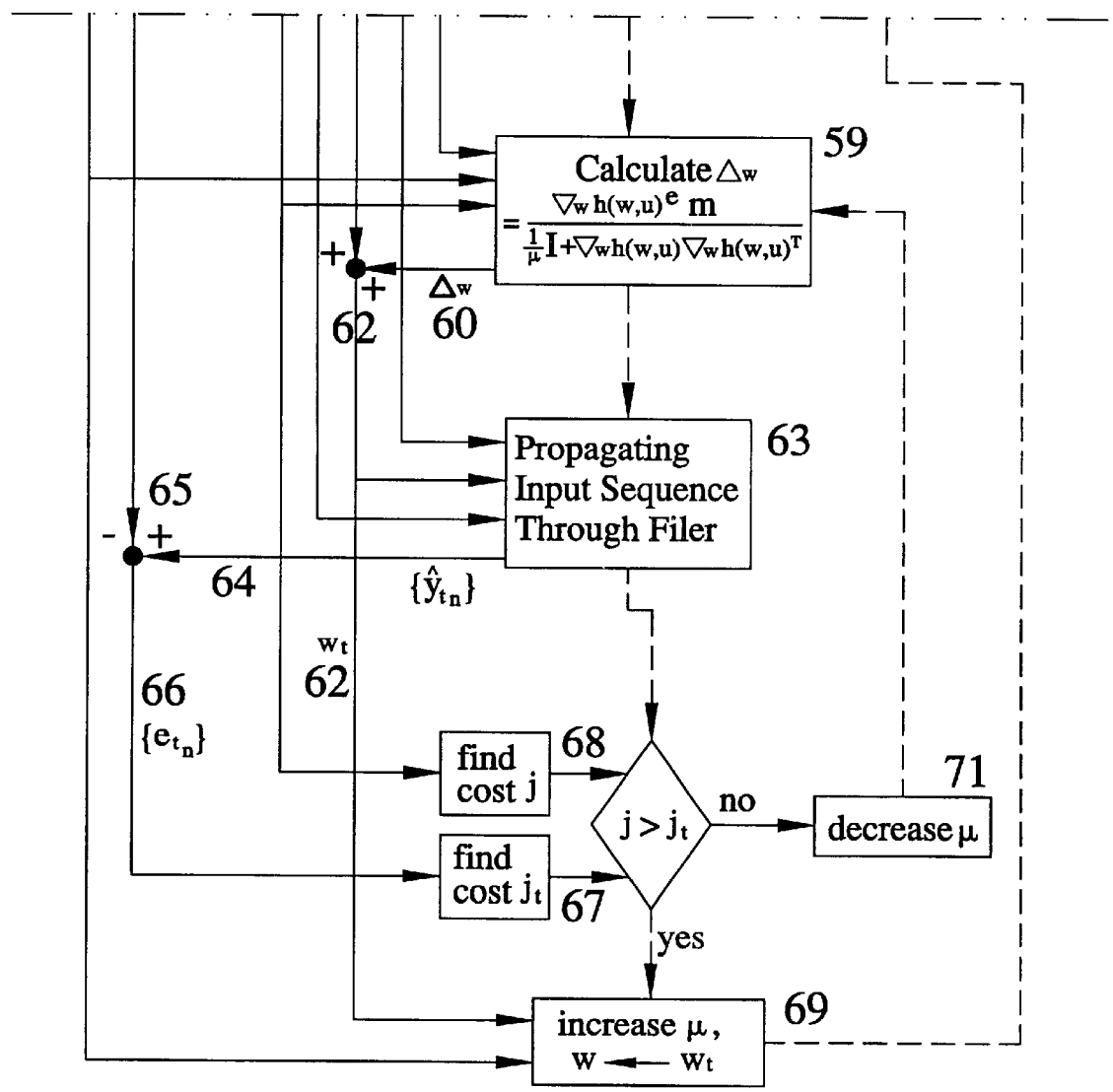

FIG. 1 provides a block diagram according to which the components of the invention may be combined in a preferred embodiment.

FIG. 2 displays the general architecture for a nonlinear multi-layered FIR network with restricted degrees of computational freedom using separate static nonlinear and linear dynamic components.

Figure 3:
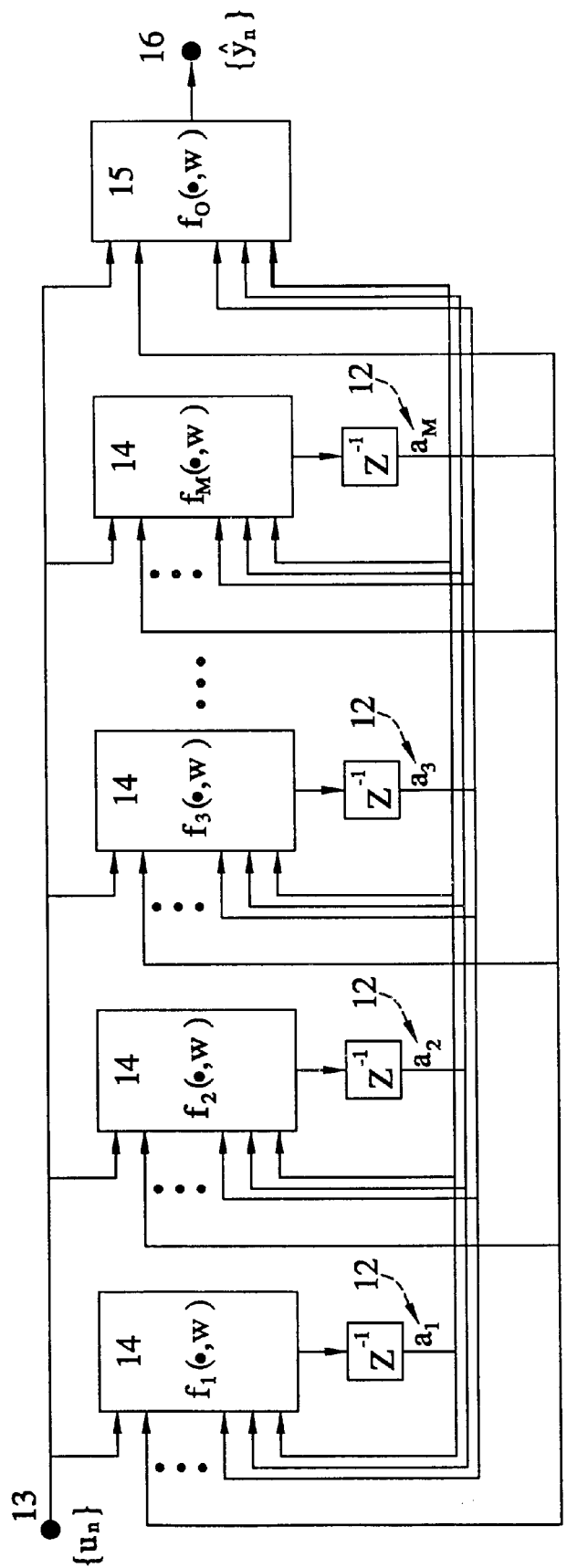

FIG. 3 displays a generic nonlinear IIR filter architecture, for which the next states and the output are assumed to be some static function of the current states, and the current inputs.

Figure 4:
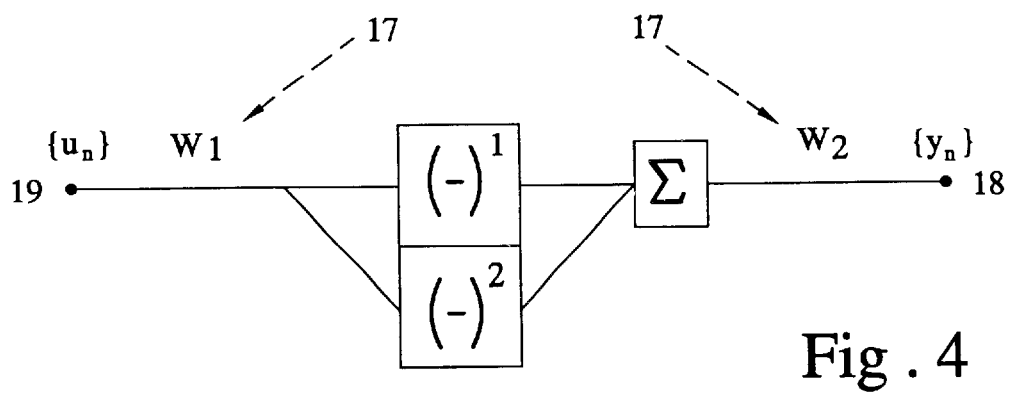

FIG. 4 displays a simple two-weight polynomial-based network without memory.

Figure 5:
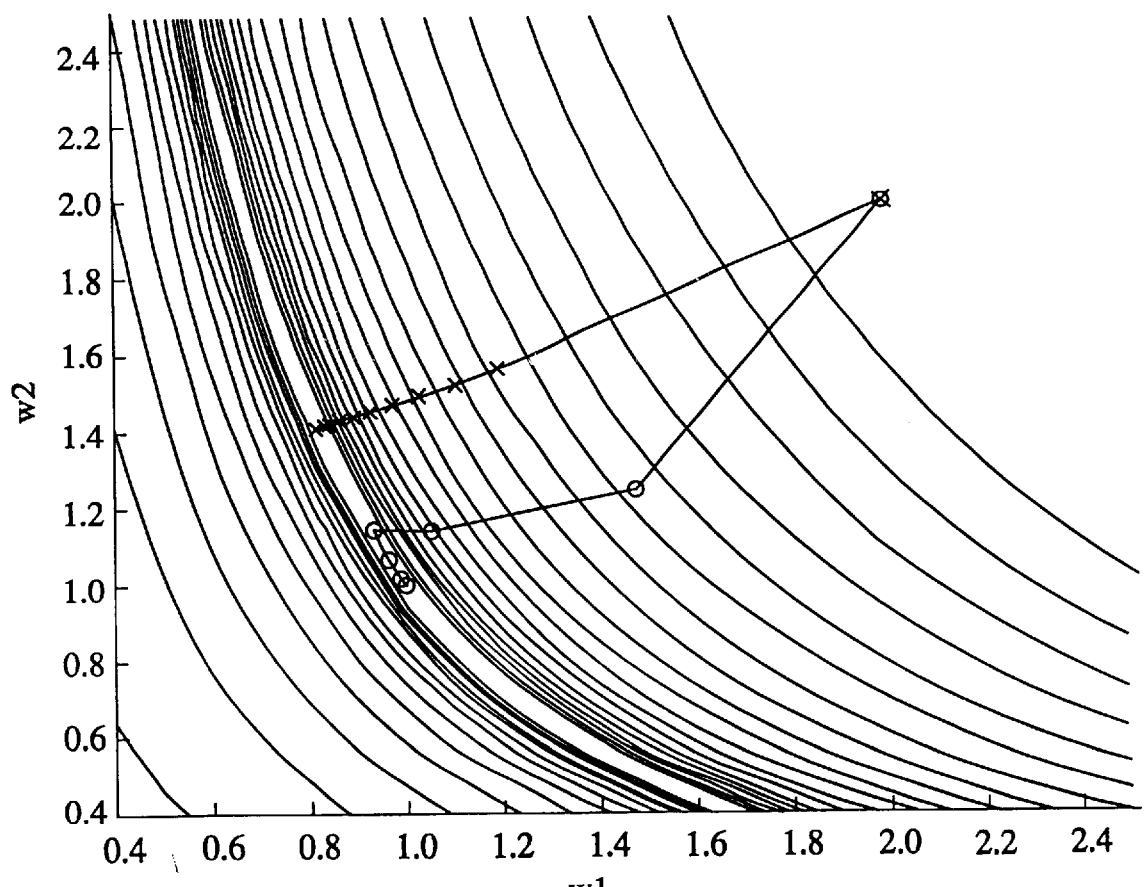

FIG. 5 displays the weight sequence over 100 epochs of training the network of FIG. 4 using BP (x) and the adaptive modified Gauss-Newton algorithm (o) respectively. Contours of constant cost are shown.

Figure 6:
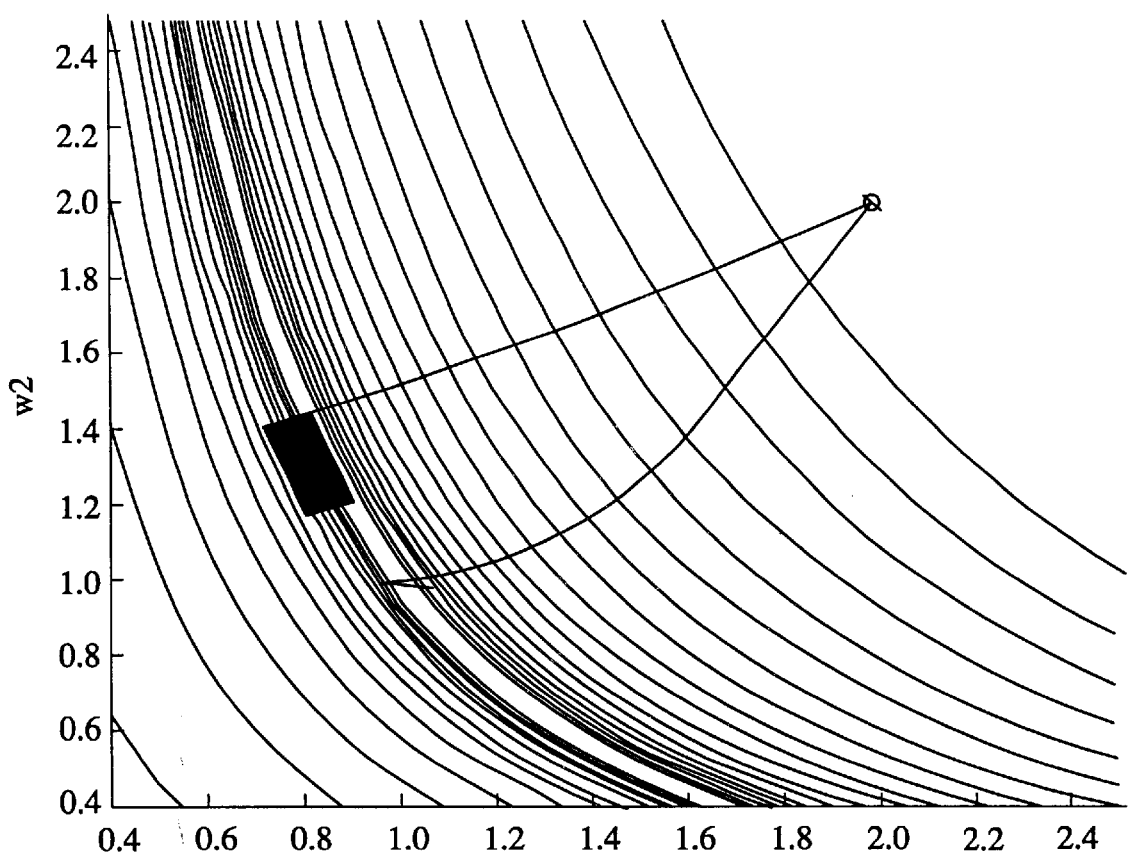

FIG. 6 displays the weight sequence over 100 epochs of training the network of FIG. 4 using BP (top line) and the adaptive modified Gauss-Newton algorithm with update steps constrained to a magnitude of 0.1.

Figure 7:
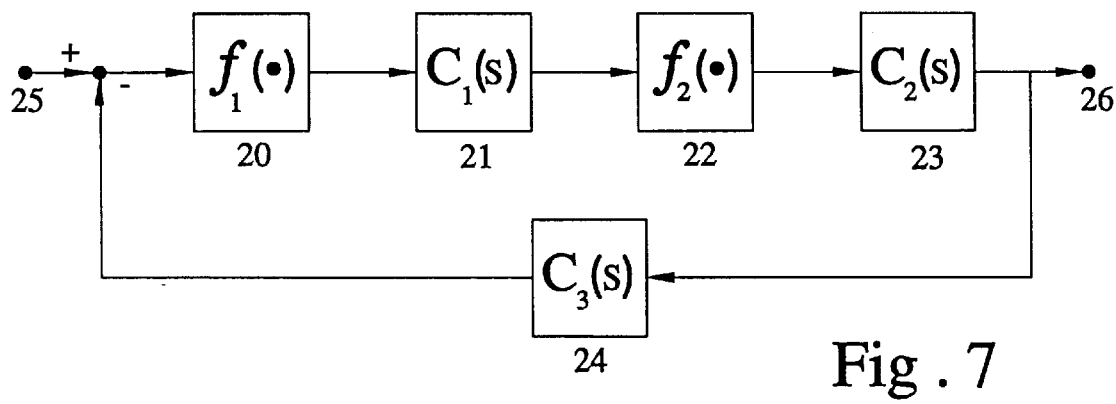

FIG. 7 displays a block-diagram of a generic tracking system with static nonlinearities embedded within linear dynamics, and parasitic dynamics on the feedback path.

Figure 8:
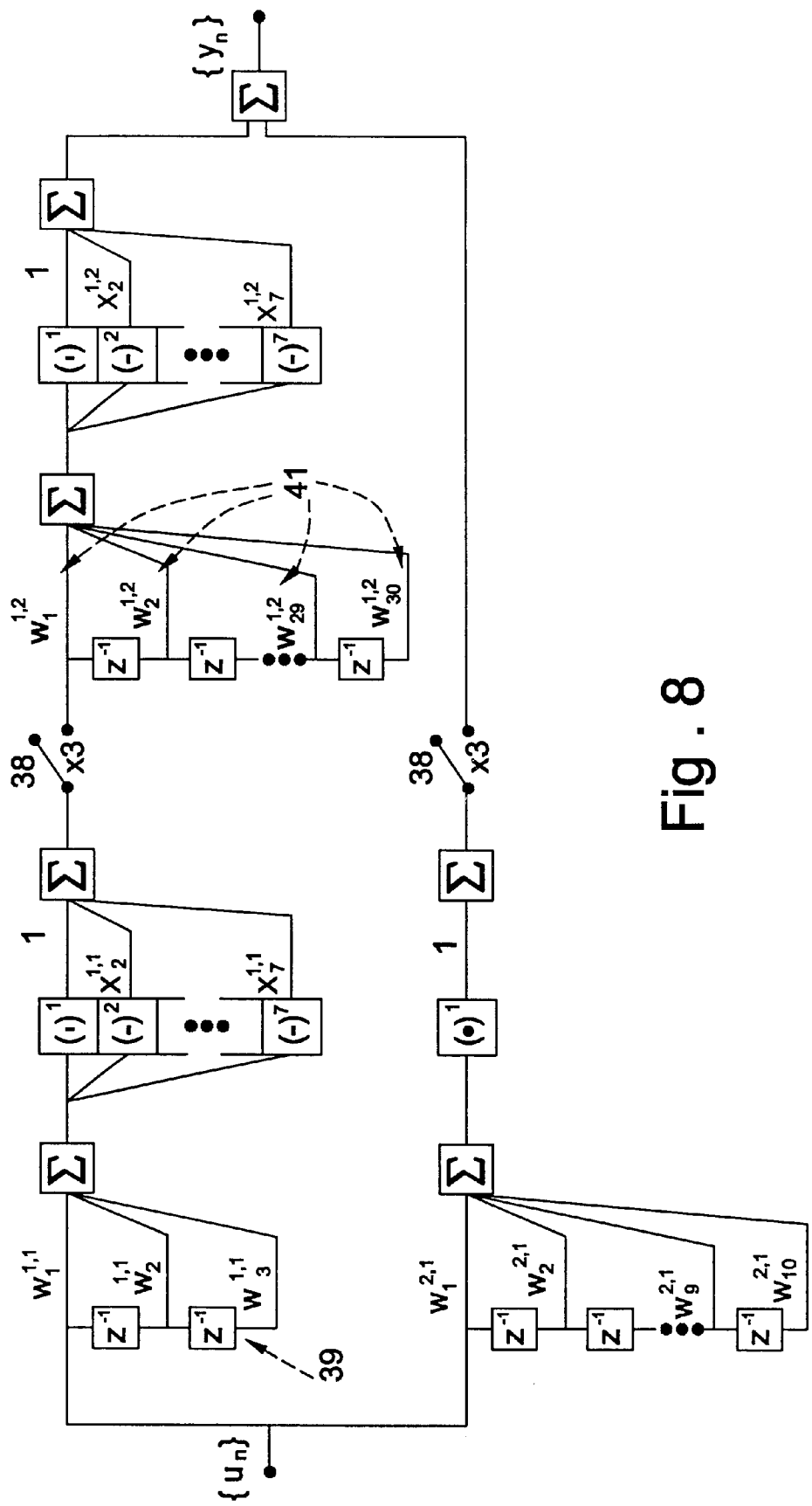

FIG. 8 displays the FIR network employed to linearize the nonlinear tracking system of FIG. 7 and equ. (43)

Figure 9:
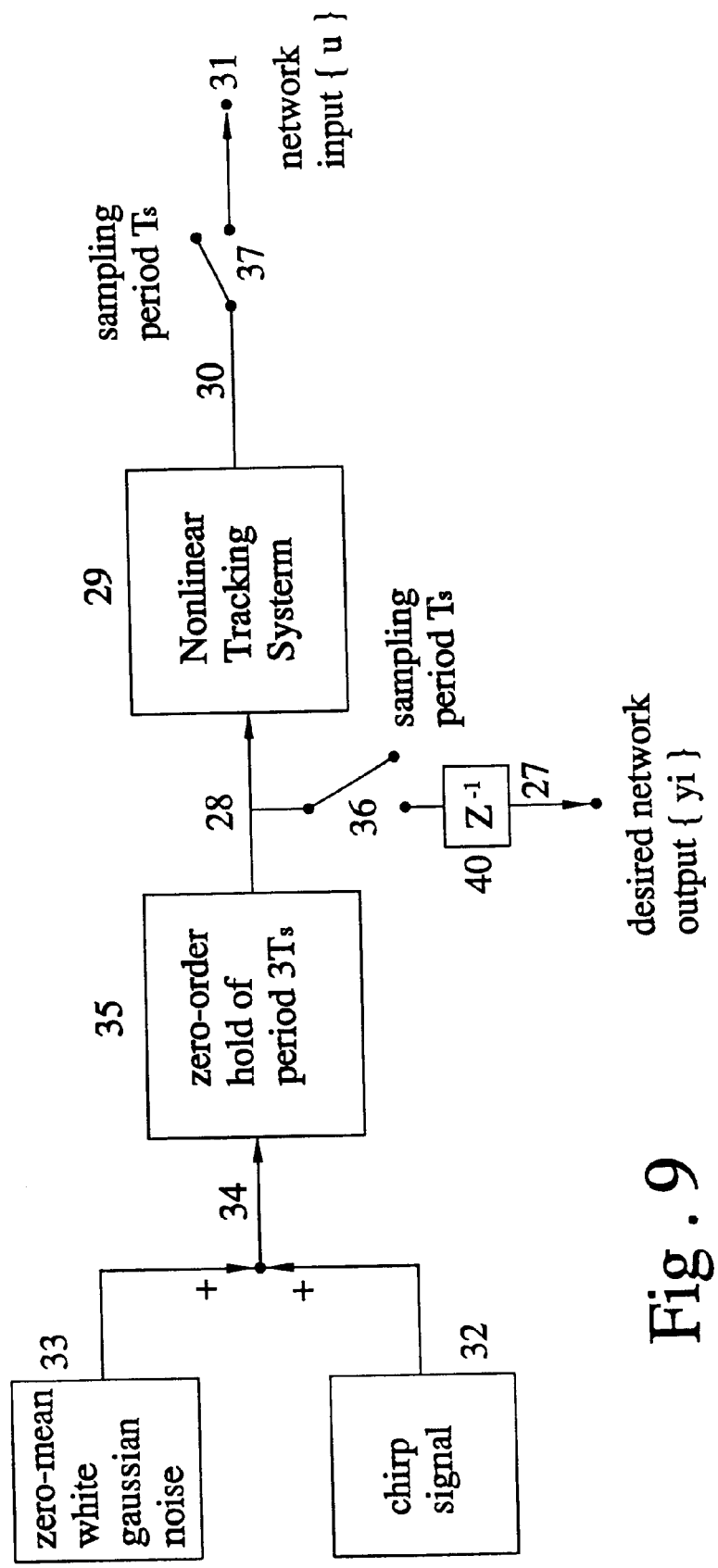

FIG. 9 displays a technique for acquiring training data by exciting the tracking system.

Figure 10:
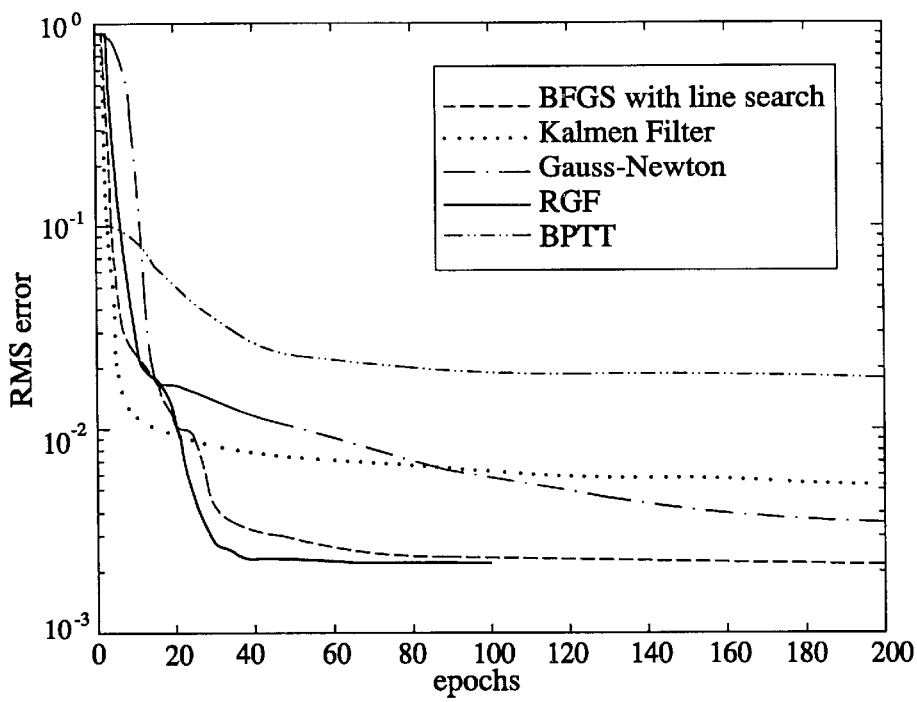

FIG. 10 displays the RMS error of the network of FIG. 8 over 100 epochs using the adaptive modified Gauss-Newton algorithm, and over 200 epochs using BPTT, Kalman Filtering, the Gauss-Newton technique, and BFGS with a line search.

Figure 11:
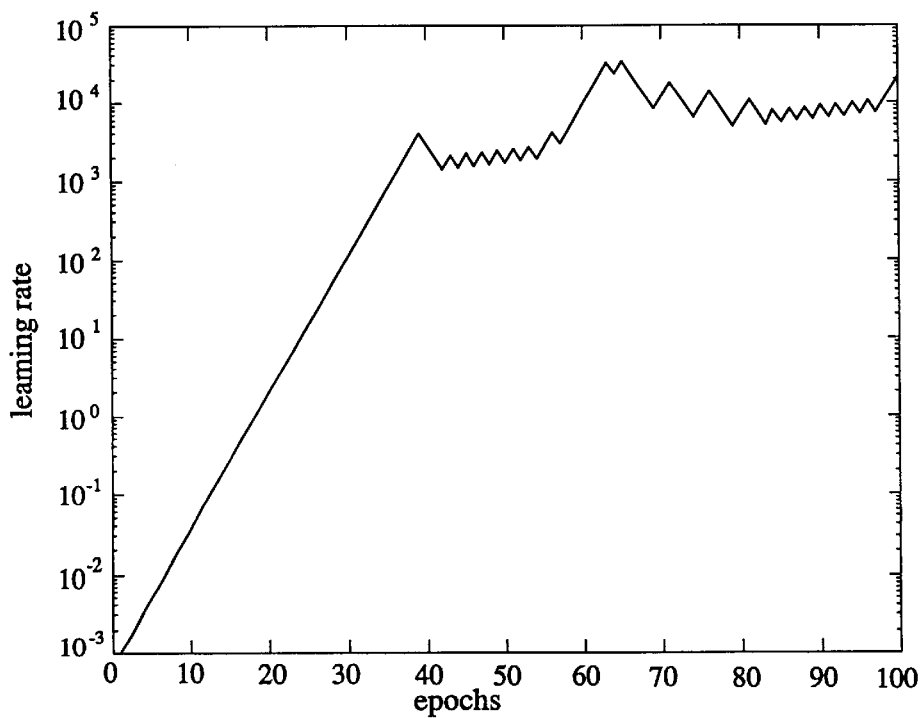

FIG. 11 displays the learning rate, $\mu_k$, over 100 training epochs for the network of FIG. 8 using the adaptive modified Gauss-Newton algorithm.

Figure 12:
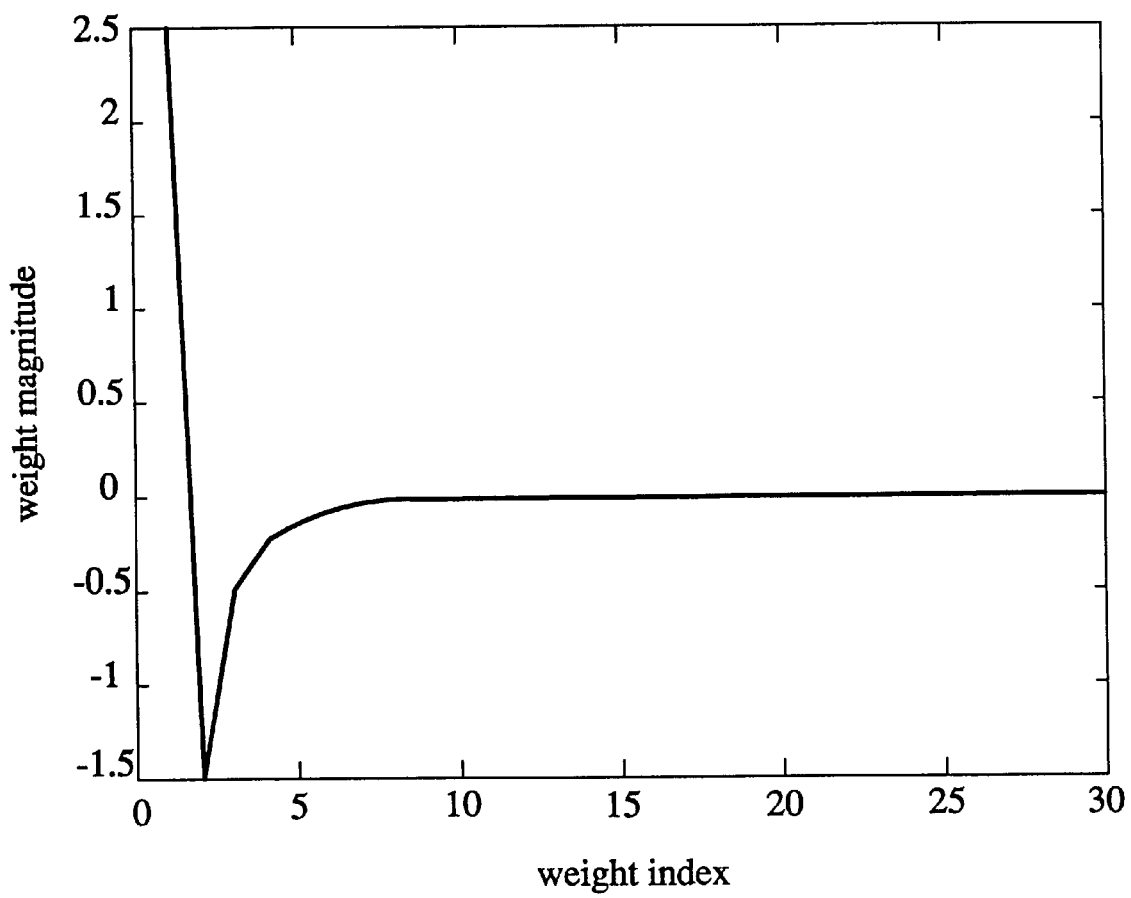

FIG. 12 displays the trained weights 42 of the FIR filter at layer 2 of path 1 in FIG. 8.

Figure 13:
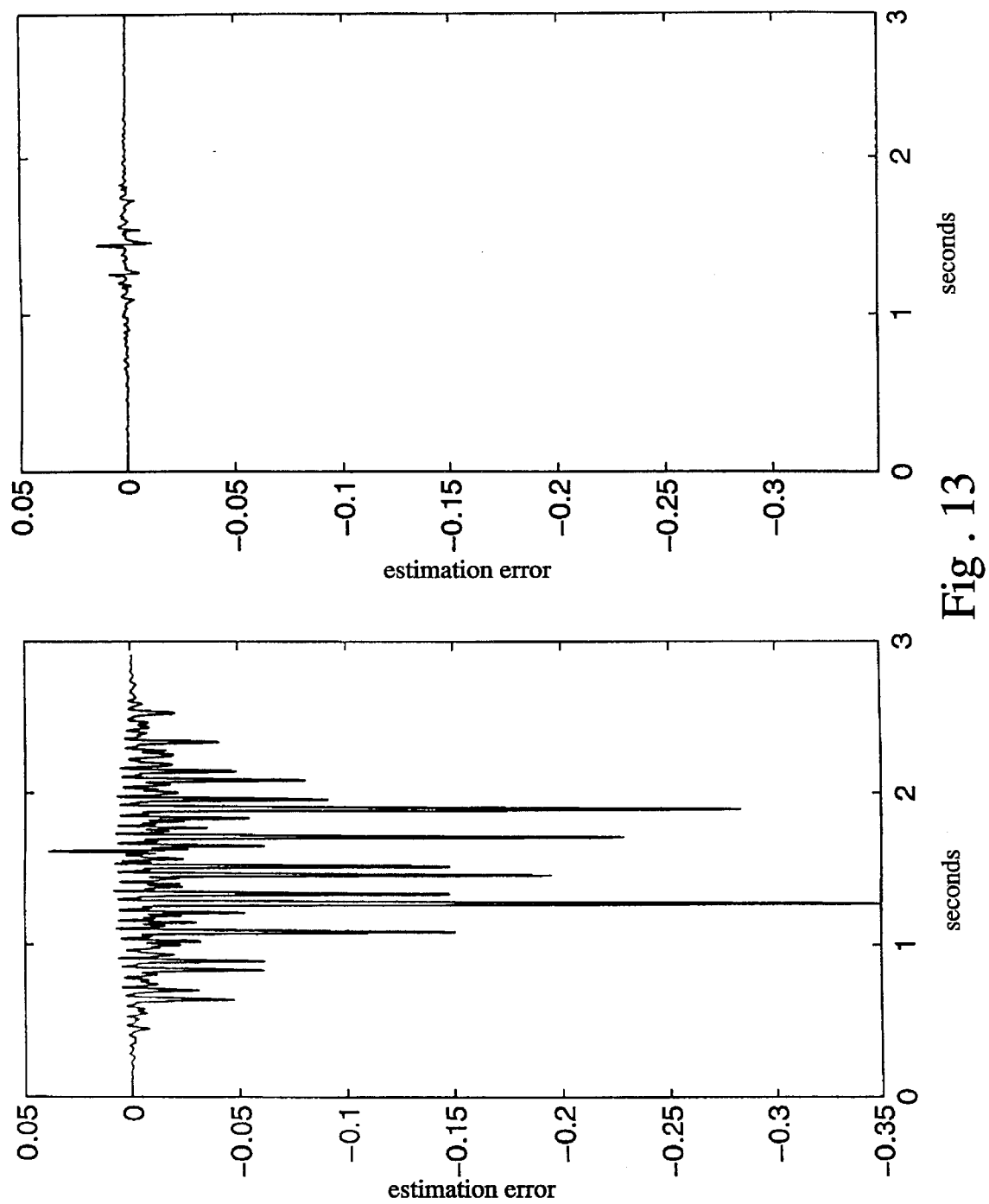

FIG. 13 displays on the left the error produced by an analytical inversion of the linearized tracking system of FIG. 7. This illustrates the extent of the error due to nonlinear distortion. On the right is shown the error in the output of the trained network of FIG. 8.

Figure 14:
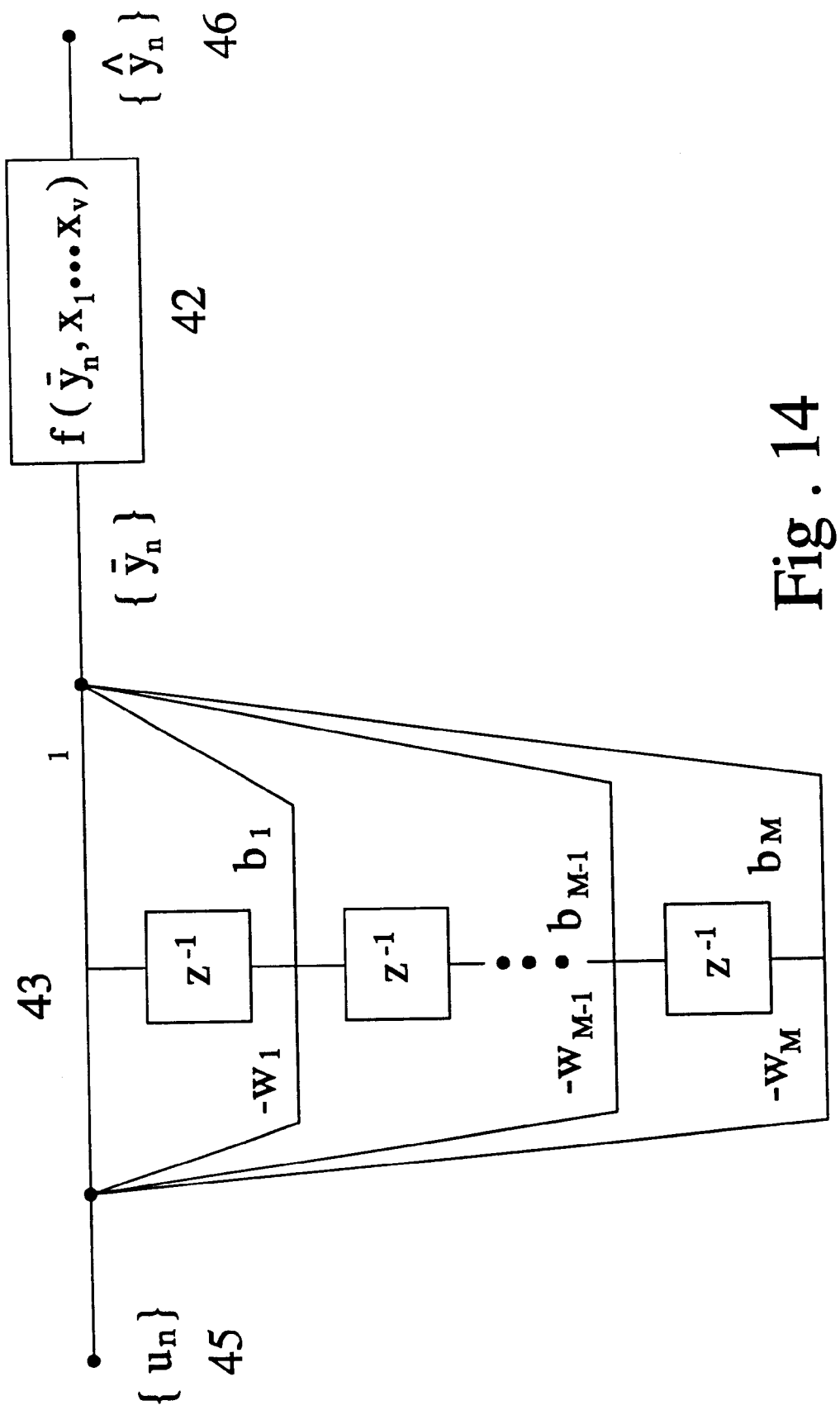

FIG. 14 displays the Wiener model filter used to emulate a nonlinear audio amplifier.

Figure 15:
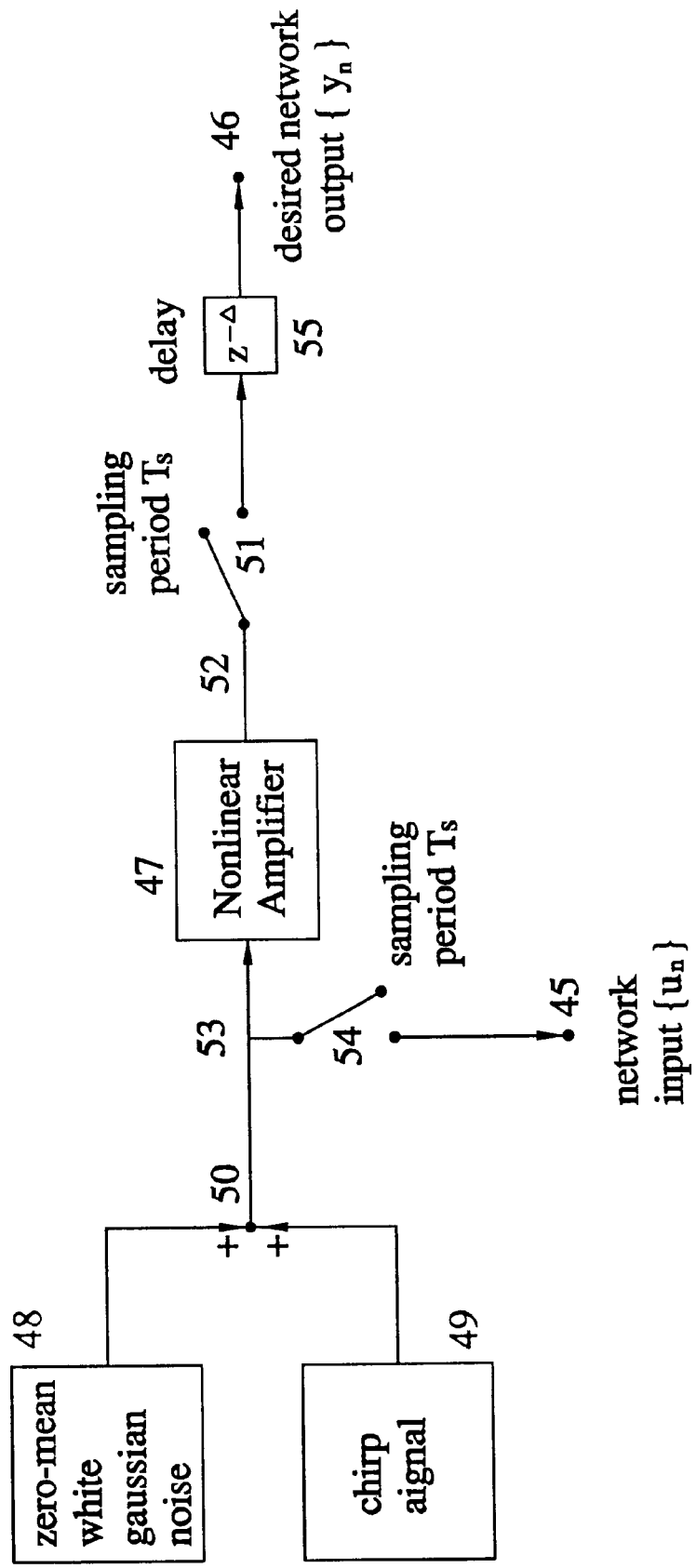

FIG. 15 displays a method by which data is gathered for training the filter of FIG. 14.

Figure 16:
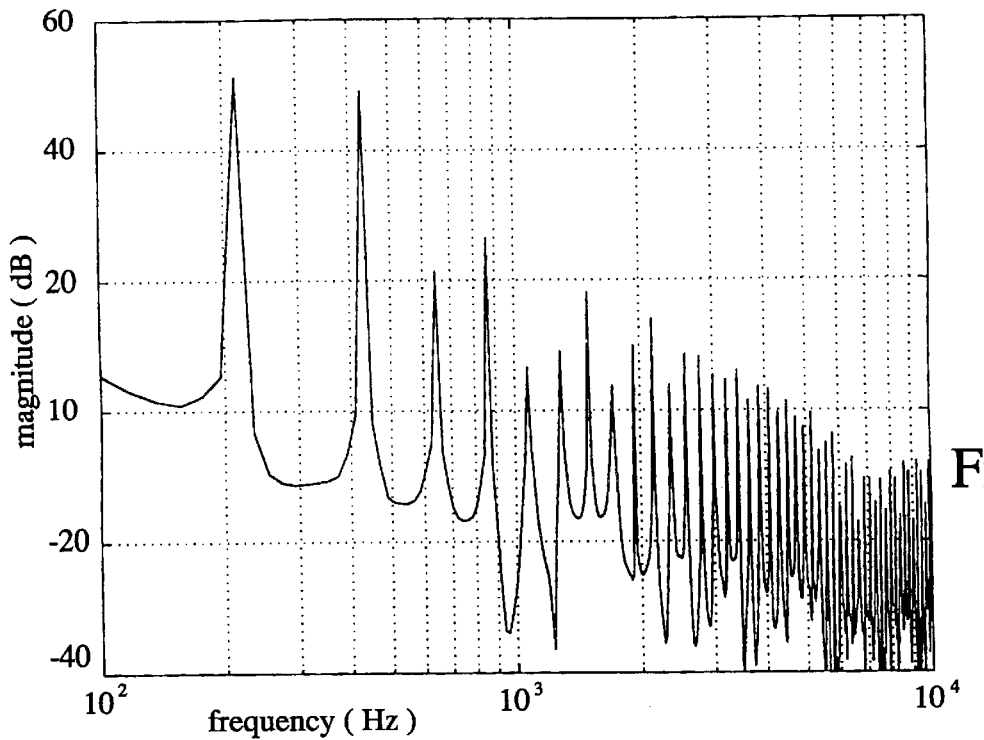

FIG. 16 displays the spectral response of the nonlinear amplifier to a dual tone signal.

Figure 17:
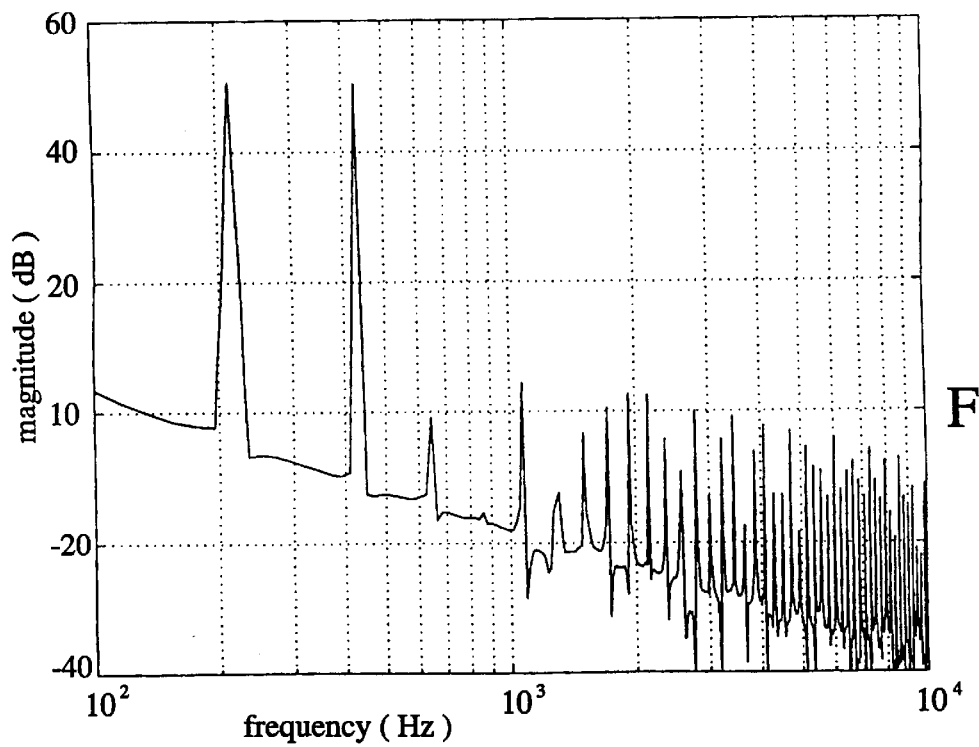

FIG. 17 displays the spectral response of the nonlinear amplifier to a prewarped dual tone signal.

V. SUMMARY OF THE INVENTION

This invention concerns a method for applying a Newton-like training algorithm to a dynamic nonlinear adaptive filter which has embedded memory. FIG. 1 provides a block diagram according to which the components of the invention may be combined in a preferred embodiment. The solid lines indicate the flow of data between steps; the dashed lines indicate the flow of control between steps. Initially, 47, the dynamic nonlinear system to be emulated by the filter is decomposed to linear dynamic elements, and nonlinear elements. Based upon this decomposition, a filter architecture, h 48, consisting of adaptable static nonlinear components, and adaptable linear components, is Taylor-made 49 for the desired dynamic operation 47. Next 51, using an initial set of filter parameters w 53, and architecture h 48, a training input sequence $\{u_n\}$ 50 is propagated through the filter to obtain an output sequence $\{\hat{y}_n\}$ 52. An error signal $\{e_n\}$ 55 is created by subtracting from $\{\hat{y}_n\}$ 52 the desired output sequence $\{\hat{y}_n\}$ 56. Using h 48, $\{e_n\}$ 55, and w 53 a novel technique 57 is used to construct a single matrix $\nabla h_w$ 58 which relates each network parameter to the error it produces over the full sequence $\{e_n\}$ 55. Using $\nabla h_w$ 58, $\{e_n\}$ 55, and a learning rate $\mu$, a novel Newton-like update algorithm 59, is used to determine a weight update vector $\Delta w$ 60. A temporary parameter set $w_t$ 62 is created by summing $\Delta w$ 60 and w 61. Using $w_t$ 62 and h 48, the training input sequence $\{u_n\}$ 50 is again propagated 63 through the filter to obtain output sequence $\{\hat{y}_{t_n}\}$ 64. $\{e_{t_n}\}$ 66 is created by 65 differencing $\{\hat{y}_{t_n}\}$ 64 and $\{\hat{y}_n\}$ 56. Costs 67,68 are computed from the error sequences 55,66, such as $J=\Sigma_n e_n^2$ and $J_t=\Sigma_n e_{t_n}^2$. If $J>J_t$, $\mu$ 70 is increased 69, the new w is set equal to $w_t$ 69, and the process is commenced at block 51. Otherwise, $\mu$ 71 is decreased 71 and the process commences at 59.

In section VI is described the novel Newton-like algorithm for updating the parameters of a network with embedded memory. The technique is based on a modification of the Gauss-Newton optimization method. The modification involves an adaptive parameter which ensures that the approximation of the cost's Hessian matrix is well-conditioned for forming an inverse. In section VII is described a technique for relating the output error of a nonlinear filter with embedded FIR dynamics to the filter parameters, such that a Newton-like technique can be applied. This method involves creating a single matrix which relates all the network parameters to all the error they generate over the full time sequence. In section VIII is described a technique for relating the output error of a general nonlinear IIR filter to the filter parameters, such that a Newton-like technique can be applied. Section IX discusses the superior behavior of the adaptive modified Gauss-Newton method over steepest-descent methods such as BPTT. In section X, we describe how a dynamic nonlinear adaptive filter may be Taylor-made for a particular problem, and trained by the new algorithm. In this section, the performance of the algorithm is compared with that of other optimization techniques, namely BPTT, Kalman Filtering, a Gauss-Newton method, and the Broyden-Fletcher-Goldfarb-Shanno (BFGS) method which are known to those skilled in the art.

VI. The Adaptive Modified Gauss-Newton Algorithm

In order to clearly explain the invention, this section describes the new method, as well as the rationale behind it. In a preferred embodiment, we assume that a training input sequence $\{u_n\}$ 53, $n \in \{1 \ldots N\}$ is propagated 51 through the adaptive network. We consider the network to be represented by a known nonlinear filter operator, h 48, which is determined solely by the network architecture. h 51 operates on (w, u) 50,53 where u is an input vector of length N and w is a vector of all the adaptable parameters in the network. The vector which is created from the outputs of the network $\{\hat{y}_n\}$ 52 in response to the training, sequence 50 is denoted h(u,w).

At each training epoch, which we denote with subscript k, we find an iterative update of the parameter vector, $w_k$. At epoch k, one may describe the sequence of desired training outputs as a vector:

$$y_k = h(w^*, u_k) + v_k \quad (1)$$

where $w^*$ is the vector of ideal weights which training seeks to discover, $u_k$ is a vector of inputs at epoch k and $v_k$ is a vector of unknown disturbances. If the data in $u_k$ and $y_k$ are sampled from real-world continuous signals, then $v_k$ can be regarded as a vector of noise on the ideal system inputs or sampled outputs. $v_k$ Can also be regarded as error resulting from the architectural imperfections of the network, such as emulating IIR linear dynamics with an FIR structure. Alternatively, in a control applications, $v_k$ could result from the physical impossibility of a control law bringing all states instantaneously to 0 in a stable system. The subscript k on $y_k$ and $u_k$ indicates that the inputs, and desired output set can be changed at each epoch, however, in many applications they are held constant over several epochs. The invention involves an updating strategy F, which iteratively determines the current weight vector from the previous weight vector and the input-output truth model, $w_k = F(w_{k-1}, u_k, y_k)$. To select amongst updating strategies, we define the following cost function:

$$J(w_k, u_k) = \tfrac{1}{2} e_{fk}^T e_{fk} = \tfrac{1}{2}(h(w_k, u_k) - h(w, u_k))^T (h(w_k, u_k) - h(w, u_k)) \quad (2)$$

where $e_{fk}$ is the vector of filtered errors, or errors in the absence of disturbance $v_k$. Then, we seek that F which minimizes J ($F(w_{k-1}, u_k, y_k), u_k$).

Note that the inputs to F restrict our exact knowledge of J's variation with respect to the weights to the first derivative, $\nabla w_J$. Additional measurements can be performed on a network to estimate higher derivatives of J at each epoch, however, the performance of such methods for our class of problem does not justify their added computational complexity.

We determine F by expanding the filter function h around the current value of the weights vector. By evoking the mean value theorem, we can describe the filter outputs at epoch k:

$$h(w_k, u_k) = h(w_{k-1}, u_k) + \nabla_w h(w_{k-1}, u_k)^T (w_k - w_{k-1}) + \tfrac{1}{2}(w_k - w_{k-1})^T \nabla_w^2 h(\overline{w}_{k-1}, u_k)(w_k - w_{k-1}) \quad (3)$$

where $\overline{w}_{k-1}$ is some weight vector for which each component lies between the corresponding components of $w_{k-1}$ and $w_k$. Note that the notation in (3) is inaccurate—the term $\nabla_w^2 h(\overline{w}_{k-1}, u_k)$ is not a matrix in this context, but a tensor. Note also that the matrix $\nabla_w h(w_{k-1}, u_k)$, which contains the derivatives of the outputs with respect to all parameters in the network over the full time sequence, is difficult to calculate for nonlinear FIR and IIR filters which contain embedded memory. This will be discussed in the next section. Suppose now, that at every epoch, we apply the old weight vector to the current inputs and compare the filter outputs with the current desired set of outputs. The measured error is:

$$e_{mk} = y_k - h(w_{k-1}, u_k) \quad (4)$$

and in a preferred embodiment, the cost function we actually measure is $$J_{mk} = \tfrac{1}{2} e_{mk}^T e_{mk}. \quad (5)$$

The filtered error, $e_{fk}$, which we seek to minimize, is not directly measurable. However, using equation (3) and (4) we can describe this filtered error in terms of the measured error as $$e_{fk} = e_{mk} - \nabla_w h(w_{k-1}, u_k)^T(w_k - w_{k-1}) - v_k - \frac{1}{2}(w_k - w_{k-1})^T \nabla_w^2 h(\overline{w}_{k-1}, u_k)(w_k - w_{k-1}) \quad (6)$$

Consider the last term on the RHS involving the second derivative of h at $\overline{w}_{k-1}$. This indicates how far $h(w_k, u_k)$ is from a first-order approximation at $w_{k-1}$. We assume that this term $\to 0$ as the weights converge. If we further make the strong assumption that the disturbance term $v_k$ is negligible, then we drop these terms from the estimation of $e_{fk}$ and approximate cost as $$\hat{J}(w_k, u_k) = \frac{1}{2}(e_{mk} - \nabla_w h(w_{k-1}, u_k)^T(w_k - w_{k-1}))^T(e_{mk} - \nabla_w h(w_{k-1}, u_k)^T(w_k - w_{k-1})) \quad (7)$$

We can calculate the derivative of this cost with respect to $w_k$.

$$\nabla_w \hat{J}(\Delta w_{k-1}) = -\nabla_w h(w_{k-1}, u_k)(e_{mk} - \nabla_w h(w_{k-1}, u_k)^T(w_k - w_{k-1})). \quad (8)$$

The invention introduces the novel criterion that the update step taken, $\Delta w_{k-1} = w_k - w_{k-1}$, be parallel with the gradient of the quadratic cost estimate at the new location, $w_k$, to which we are stepping:

$$\Delta w_{k-1} = -\mu_k \nabla_w \hat{J}(w_k, u_k) \quad (9)$$

$$= \mu_k \nabla_w h(w_{k-1}, \mu_k)(e_{mk} - \nabla_w h(w_{k-1}, u_k)^T \Delta w_{k-1})$$

where we have introduced $\mu_k$, as a constant of proportionality. In a linear filter, this criterion would encourage updates which move more directly towards the quadratic cost minimum than a steepest descent update. For the invention, since $\mu_k$ is a learning rate which can be freely adjusted, we solve (9) for $\Delta w_{k-1}$:

$$\Delta w_{k-1} = \left(\frac{1}{\mu_k} + \nabla_w h(w_{k-1}, \mu_k) \nabla_w h(w_{k-1}, \mu_k)^T\right)^{-1} \quad (10)$$
$$\nabla_w h(w_{k-1}, \mu_k) e_{mk}$$

Equ. 10 is the Adaptive Modified Gauss-Newton algorithm, which will henceforth be referred to as AMGN. To place this aspect of the invention in context with respect to classical optimization, consider Newton's iterative technique applied to the new set of inputs at each epoch:

$$w_k = w_{k-1} - \mu_k (\nabla_w^2 J(w_{k-1}, u_k))^{-1} \nabla_w J(w_{k-1}, u_k) \quad (11)$$

Since the Hessian of the cost $\nabla_w^2 J(w_{k-1}, u_k)$ is difficult to calculate, the Gauss-Newton technique uses an estimation of the Hessian of the cost, which for the cost of equ.(2) would be $$\nabla_w^2 J(w_{k-1}, u_k) = \nabla_w^2 h(w_{k-1}, u_k) e_{f_k} + \quad (12)$$
$$\nabla_w h(w_{k-1}, \mu_k) \nabla_w h(w_{k-1}, \mu_k)^T$$

$$\approx \nabla_w h(w_{k-1}, \mu_k) \nabla_w h(w_{k-1}, \mu_k)^T \quad (13)$$

This approximation is sound as one converges to a minimum at which $e_{fk} \to 0$ as $k \to \infty$. Problems arise, however, when $\nabla_w^2 h(w_{k-1}, u_k) e_{fk}$ is not negligible, or when the matrix $$\nabla_w h(w_{k-1}, u_k) \nabla_w h(w_{k-1}, u_k)^T \quad (14)$$

is poorly conditioned. In the context of the invention, the latter phenomenon is particularly prevalent when the training signal is narrowband, or the network architecture has excessive degrees of freedom. To ameliorate these effects, the Gauss-Newton algorithm can be modified by adding some positive definite matrix to (14) before taking the inverse, with the objective of improving the condition number, and the convergence characteristics. This invention describes an adaptive method for controlling the conditioning of the inverse in (10) using the learning rate $\mu_k$.

If $\mu_k$ is too large, this can negatively impact the update direction for the reasons discussed above; if $\mu_k$ is set too small, convergence is retarded. Therefore, we determine $\mu_k$ adaptively by successive step size augmentation and reduction. In a preferred embodiment $\mu$ is augmented by some factor, $\epsilon_a$, after each update of the weights which diminishes cost, and reduced by some factor, $\epsilon_r$, after each update which enlarges cost. It will be noted by one skilled in the art that other methods for augmenting and reducing $\mu$ based on the performance of each weight update can be used, without changing this essential idea in the invention.

One skilled in the art will also recognize that for complex cost functions, AMGN can be trapped in non-global minima of cost. One method of ameliorating this problem is to multiply each weight update by some term proportional to $$\frac{\max(J_{m_k} - J^*, 0)}{\|\nabla_w h(w_{k-1}, u_k) e_{m_k}\|_2}$$

where $J_{mk}$ is the measured cost at epoch k, $J^*$ is some predetermined good enough value of cost, and $\| \|_2$ denotes the 2-norm of the vector. In this way, if the parameters approach a local minimum, but $J_{mk} > J^*$, the weight updates will grow large so that the local minimum can be escaped. This and many other techniques for avoiding local minima may be used to augment AMGN without changing the essential idea.

VII. Calculating the Term $\nabla_w h(w_{k-1}, u_k)$ for a Nonlinear FIR Filter

This section addresses the calculation of $\nabla_w h(w_{k-1}, u_k)$ for a general nonlinear FIR network which can be decomposed into static nonlinear and linear dynamic components, such as that displayed in FIG. 2. Each layer 7 of this network consists of a linear FIR filter 2 feeding into a nonlinear generalized single-layer subnetwork (GSLN) 3 which generates the weighted sum of a set of static nonlinear functions. A GSLN refers to any weighted sum of nonlinear functions $[f_1 \ldots f_v]$ where the weights $[x_1 \ldots x_v]$ are adjustable parameters.

Since the initial states of the FIR filters 2 are unknown, we must wait until our known set of inputs 8 have propagated through the network before useful training data is generated at the output 9. Therefore, the output sequence 9 which we use to train the filter will be of length $$N - \sup_p \left( \sum_{l=1}^{LP} M^{p,l} \right) + 1$$

where $M^{p,l}$ is the number of taps of the FIR filter at layer l of path p, and the sup operation selects that path with the most cumulative delays. One may consider the multi-layer filter of FIG. 2 to be represented by a known nonlinear filter operator, h, which is determined solely by the network architecture. h operates on (w, u) where u is a vector of length N containing all the inputs 8 and w is a vector, of length $$\sum_{p,l}(M^{p,l}+V),$$

which contains every adaptable parameter in the network. The output sequence 9 is stored in a vector of length $$N - sup_p\left(\sum_{l=1}^{LP} M^{p,l}\right) + 1$$

which we denote h(w, u) as described above.

The matrix term $\nabla_w h(w_{k-1}, u_k)$, which contains the derivative of each element of the output sequence with respect to each parameter in the network, is easy to calculate in a one-layered network (where L=1). In this case, each row is simply the sequence of inputs that excite the corresponding weight in $w_{k-1}$. We will now describe how this term is found in a multi-layered network such as FIG. 2, with FIR filters 2 and nonlinear components 3 at hidden layers. All indication of the epoch k will be abandoned in this section for economy of notation. Keep in mind that the network parameters and output sequences are epoch-dependent, however.

Firstly, we need to detail notation for the propagation of data through the layers of the network. Consider a single layer l 7 in the path p of the filter of FIG. 2. For the sake of clarity, we have boxed this layer in the figure. In isolation, the single layer implements a Wiener-type filter [11]. The layer has two sets of weights, those determining the output of the FIR filter $$\omega^{p,l} = [w_1^{p,l} \ldots w_{M^{p,l}}^{p,l}]^T \quad (15)$$

and those determining the weighting of each function of the volterra node $$x^{p,l} = [x_1^{p,l} \ldots x_V^{p,l}]^T. \quad (16)$$

Imagine the output of the GSLN of layer l−1 is described by the matrix $$F^{p,l-1} = [F_1^{p,l-1} \ldots F_{N^{p,l-1}}^{p,l-1}]^T \quad (17)$$

where $N^{p,l-1}$ is the length of the vector of outputs from layer l−1 of path p:

$$N^{p,l-1} = N - \left(\sum_{i=1}^{l-1} M^{p,i} - 1\right).$$

We can create a matrix of the sequential activation states of the FIR filter 2 at layer l 7, $$A^{p,l} = \begin{bmatrix} F_{M^{p,l}}^{p,l-1} & F_{(M^{p,l}-1)}^{p,l-1} & \cdots & F_1^{p,l-1} \\ F_{(M^{p,l}+1)}^{p,l-1} & F_{M^{p,l}}^{p,l-1} & & \\ \vdots & & & \vdots \\ F_{N^{p,l-1}}^{p,l-1} & \cdots & \cdots & F_{N^{p,l-1}}^{p,l-1} \end{bmatrix} \quad (18)$$

The output of the FIR filter 2 at this layer 7 can then be found according to:

$$a^{p,l} = A^{p,l} \times \omega^{p,l} \quad (19)$$

$$[a_1^{p,l} \ldots a_{N^{p,l}}^{p,l}]^T \quad (20)$$

where × is a matrix multiplication. This output vector is used in turn to construct the matrix, $B^{p,l}$, of inputs which excite the weights of the GSLN 3 of layer l 7:

$$B^{p,l} = \begin{bmatrix} f_1(a_1^{p,l}) & f_2(a_1^{p,l}) & \cdots & f_V(a_1^{p,l}) \\ f_1(a_2^{p,l}) & f_2(a_2^{p,l}) & & \\ \vdots & & & \vdots \\ f_1(a_{N^{p,l}}^{p,l}) & \cdots & \cdots & f_V(a_{N^{p,l}}^{p,l}) \end{bmatrix} \quad (21)$$

The output 10 of the GSLN is then found by the weighted summation:

$$F^{p,l} = B^{p,l} \times x^{p,l} \quad (22)$$

$$= [F_1^{p,l} \ldots F_{N^{p,l}}^{p,l}]^T \quad (23)$$

In a similar fashion, we can describe the gradient of the function implemented by the GSLN 3 for each set of inputs according to:

$$F'^{p,l} = B'^{p,l} \times x^{p,l} \quad (24)$$

$$= [F_1'^{p,l} \ldots F_{N^{p,l}}'^{p,l}]^T \quad (25)$$

where $$B'^{p,l} = \begin{bmatrix} f_1'(a_1^{p,l}) & f_2'(a_1^{p,l}) & \cdots & f_V'(a_1^{p,l}) \\ f_1'(a_2^{p,l}) & f_2'(a_2^{p,l}) & & \\ \vdots & & & \vdots \\ f_1'(a_{N^{p,l}}^{p,l}) & \cdots & \cdots & f_V'(a_{N^{p,l}}^{p,l}) \end{bmatrix} \quad (26)$$

We can begin to describe the calculation of $\nabla_w h(w_{k-1}, u_k)$ by recognizing, as would one skilled in the art, that this term is trivial to find in a one-layer linear network. Consequently, we seek to condition the inputs to each network layer so that weights of hidden layers l={1 . . . L−1} can be trained similarly to the weights of the output layer L. This is achieved by pre-multiplying the inputs to each layer by the differential gain which that layer's output 10 sees due to subsequent layers in the network. To illustrate this idea, consider the function $h^{p,l}$ to represent the reduced filter function for a single layer. i.e.

$$h^{p,l}(w_{k-1}^{p,l}, u_k) = F^{p,l} \quad (27)$$

To find $\nabla_{w^{p,l}} h^{p,l}(w_{k-1}^{p,l}, u_k)$, the gradient of this layers' outputs 10 with respect to each of the weights in the layer, we pre-amplify the matrix of filter states, $A^{p,l}$, by the gradient of the nonlinear function 3 which corresponds to each row of FIR filter states. In this way, given the weights vector for the whole layer, $w^{p,l} = [\omega^{p,l^T} x^{p,l^T}]^T$, and the set of inputs 8 at epoch k, we can determine $$\nabla_{w^{p,l}} h(w^{p,l}_{k-1}, u_k) = [A^{p,l}.F'^{p,l} \ B^{p,l}] \quad (28)$$

generating the matrix $$\begin{bmatrix} F_{MP,l}^{p,l-1} F_1^{\prime p,l} & F_{(MP,l-1)}^{p,l-1} F_1^{\prime p,l} & \cdots & F_1^{p,l-1} F_1^{\prime p,l} & f_1(a_1^{p,l}) & \cdots & f_V(a_1^{p,l}) \\ F_{(MP,l+1)}^{p,l-1} F_2^{\prime p,l} & F_{MP,l}^{p,l-1} F_2^{\prime p,l} & \cdots & F_2^{p,l-1} F_2^{\prime p,l} & f_1(a_2^{p,l}) & \cdots & f_V(a_2^{p,l}) \\ \vdots & & & \vdots & \vdots & & \\ F_{NP,l-1}^{p,l-1} F_{NP,l}^{\prime p,l} & \cdots & & F_{NP,l}^{p,l-1} F_{NP,l}^{\prime p,l} & f_1(a_{NP,l}^{p,l}) & \cdots & f_V(a_{NP,l}^{p,l}) \end{bmatrix} \quad (29)$$

Note that the operation in (28) multiplies each row of $A^{p,l}$ with the element in the corresponding row of $F^{\prime p,l}$. The concept applied to (28) can be extended to the entire filter of FIG. 2 if we realize that the outputs of layer l, which excite the FIR filter 2 at layer l+1, do not see a static differential gain due to the subsequent layer, but rather a time-varying gain as the outputs propagate through each tap in the filters of layer l+1—as well as subsequent layers. This time-varying gain can be taken into account by convolving the inputs to each layer with the weights of the FIR filters 2 at subsequent layers, and then multiplying the convolved inputs by the gradient due to the nonlinear GSLN 3 at the subsequent layer. We define the convolution operation as follows:

Given any set of weights for an FIR filter 2

$$\omega = [w_1 \ldots w_\alpha] \quad (30)$$

and a matrix of inputs $$F = \begin{bmatrix} F_\beta & \cdots & F_1 \\ \vdots & & \vdots \\ F_N & \cdots & F_{N-\beta+1} \end{bmatrix} \quad (31)$$

we have the convolution of F with $\omega$ $$C_\omega(F) = \begin{bmatrix} \sum_{i=1}^{\alpha} F_{\beta+i-1}\omega_{\alpha-i+1} & \sum_{i=1}^{\alpha} F_{\beta+i-2}\omega_{\alpha-i+1} & \cdots & \sum_{i=1}^{\alpha} F_i\omega_{\alpha-i+1} \\ \sum_{i=1}^{\alpha} F_{\beta+i}\omega_{\alpha-i+1} & & \cdots & \\ \vdots & & & \vdots \\ \sum_{i=1}^{\alpha} F_{N-\alpha+i}\omega_{\alpha-i+1} & \cdots & \cdots & \sum_{i=1}^{\alpha} F_{N-\beta+1-\alpha+i}\omega_{\alpha-i+1} \end{bmatrix} \quad (32)$$

where the dimensions of $C_\omega(F)$ are $(N-\beta-\alpha+2) \times \beta$. This convolution operation is sequentially applied to each layer to account for the total time-varying differential gain which the outputs of a layer see due to all subsequent layers in the path. Hence, we can describe the derivative of the filter operator for the full path p 11 with respect to the weight vector for layer l, $w^{p,l}$, operating on the current set of weights and inputs, as follows $$\nabla_{w^{p,l}} h^p(w^p, u) = \quad (33)$$
$$[C_{w^{p,L^p}}(C_{w^{p,L^p-1}}(\cdots C_{w^{p,l+1}}([A^{p,l} \cdot F^{\prime p,l} B^{p,l}]) \cdot F^{\prime p,l+1})$$
$$\cdots \cdot F^{\prime p,L^p-1})F^{\prime p,L^p}]$$

where $L^p$ is the number of layers in path p—refer to FIG. (2). Now, by combining matrices like (33) for the weights of each layer, we can extend our calculation to find the gradient with respect to the weights vector of an entire path 11 as follows:

$$\nabla_{w^p} h^p(w^p, u) = [\nabla_{w^{p,1}} h^p(w^p, u) \quad \nabla_{w^{p,2}} h^p(w^p, u) \cdots \quad (34)$$
$$\nabla_{w^{p,L^p}} h^p(w^p, u)]$$

It is trivial to extend this to the multiple paths in the network. We combine the matrices of weights for each path, to form a vector of weights for the entire network of FIG. 2, with P total paths, $$w = \begin{bmatrix} w^P \\ w^{P-1} \\ \vdots \\ w^1 \end{bmatrix} \quad (35)$$

The derivative of the full network operator with respect to w, acting upon the current weights, w, and the inputs, u, is then $$\nabla_w h(w, u) = [\nabla_{w^P} h^P(w^P, u) \nabla_{w^{P-1}} h^{P-1}(w^{P-1}, u) \ldots \nabla_{w^1} h^1(w^1, u)] \quad (36)$$

With this matrix in hand, we are now able to implement AMGN for the dynamic nonlinear network of FIG. 2. The matrix $\nabla_w h(w, u)$ also enables one skilled in the art to apply other Newton-like optimization methods, such as BFGS, Kalman Filtering and Gauss-Newton to an FIR network with embedded memory, as is illustrated in section X. Note that method described naturally corrects each weight for the error it produces over the entire sequence of data. While the technique has been elucidated for the case of an FIR filter, a similar approach can be used to train IIR filters by propagating data through the network for a finite interval, long enough to capture the relevant system dynamics.

VIII. Calculating the Term $\nabla_w h(w_{k-1}, u_k)$ for a General IIR Filter Architecture In this section, the extension of the algorithm to nonlinear iir filters is discussed. The approach described here is very general and applies to a vast range of filter architectures. While the approach described in this section could also be applied to an FIR filter as in FIG. 2, it is less computationally efficient for that problem than the approach described in the previous section. The generic architecture for the filter of this discussion is displayed in FIG. 3.

The system has M states 12, represented at time n by the state vector $a_n = [a_{1n} \ldots a_{Mn}]^T$. We assume that the subsequent value of each state in the filter or system is some function 14 of the current states 12, the inputs 13 and the set of parameters within the network $$a_{n+1} = \begin{bmatrix} a_{1n+1} \\ \vdots \\ a_{M n+1} \end{bmatrix} = \begin{bmatrix} f_1(a_n, u_n, w) \\ \vdots \\ f_M(a_n, u_n, w) \end{bmatrix} \quad (37)$$

where $w = [w_1 \ldots w_V]^T$ is a vector of length V, containing all adaptable parameters in the network, and once again $\{u_n\}$ n=1 ... N 13 is the input sequence to the system. We assume that each output 16 of the filter or system is generated by the function 15 $\hat{y}_n = f_0(a_n, u_n, w)$. For the preferred embodiment, we assume that the states of the system 12 are all 0 before excitation with the input sequence 13 $\{u_n\}$. The sequence of outputs is then stored in a vector of length N which we denote h(w, u) as described above. The task, as in the previous section, is to determine the matrix $\nabla_w h(w, u)$.

To calculate the dependence of some output $\hat{y}_n$ on w, we use a partial derivative expansion with respect to the state vector:

$$\nabla_w \hat{y}_n = \sum_{i=1}^{n} \nabla_{a_i} \hat{y}_n \nabla_w a_i \quad (38)$$

The term $\nabla_w a_i$ in equ.(38) can be directly calculated $$\nabla_w a_i = \begin{bmatrix} \frac{\partial a_{1i}}{\partial w_1} & \cdots & \frac{\partial a_{1i}}{\partial w_V} \\ \vdots & \ddots & \vdots \\ \frac{\partial a_{Mi}}{\partial w_1} & \cdots & \frac{\partial a_{Mi}}{\partial w_V} \end{bmatrix} \quad (39)$$

$$= \begin{bmatrix} \frac{\partial f_1(a_i, u_i, w)}{\partial w_1} & \cdots & \frac{\partial f_1(a_i, u_i, w)}{\partial w_V} \\ \vdots & \ddots & \vdots \\ \frac{\partial f_M(a_i, u_i, w)}{\partial w_1} & \cdots & \frac{\partial f_M(a_i, u_i, w)}{\partial w_V} \end{bmatrix}$$

In order to calculate the term $\nabla_{a_i} \hat{y}_n$ in equ. (38), we again apply a partial derivative expansion as follows:

$$\nabla_{a_i} \hat{y}_n = \nabla_{a_n} \hat{y}_n \nabla_{a_{n-1}} a_n \cdots \nabla_{a_i} a_{i+1} \quad (40)$$

Each of these terms can now be directly calculated:

$$\nabla_{a_i} a_{i+1} = \begin{bmatrix} \frac{\partial a_{1_{i+1}}}{\partial a_{1_i}} & \cdots & \frac{\partial a_{1_{i+1}}}{\partial a_{M_i}} \\ \vdots & \ddots & \vdots \\ \frac{\partial a_{M_{i+1}}}{\partial a_{1_i}} & \cdots & \frac{\partial a_{M_{i+1}}}{\partial a_{M_i}} \end{bmatrix} \quad (41)$$

$$\nabla_{a_n} \hat{y}_n = \begin{bmatrix} \frac{\partial \hat{y}_n}{\partial a_{1_n}} & \cdots & \frac{\partial \hat{y}_n}{\partial a_{M_n}} \end{bmatrix} \quad (42)$$

$$= \begin{bmatrix} \frac{\partial f_0(a_n, u_n, w)}{\partial a_{1_n}} & \cdots & \frac{\partial f_0(a_n, u_n, w)}{\partial a_{M_n}} \end{bmatrix}$$

Based upon these equations, we present below an algorithm by which $\nabla_w h(w,u)$ can be calculated. We begin with two all-zeros matrices, $H = 0^{N \times V}$ and $J = 0^{N \times M}$. For notational clarity, note that H(i,:) refers to all the columns at row i in H, H(:, i) refers to all the rows in column i of H, and H(i: n,:) refers to the matrix block defined by all the columns and the rows from i to n.

1. $J(N,:) = \nabla_{a_N} \hat{y}_N$
2. $H(N,:) = \nabla_{a_N} \hat{y}_N \times \nabla_w a_N$
3. for i=N-1:1 step-1
4. $J(i+1: N,:) \leftarrow J(i+1: N,:) \times \nabla_{a_i} a_{i+1}$
5. $J(i: N,:) \leftarrow \nabla_{a_i} \hat{y}_i$
6. $H(i: N,:) \leftarrow H(i: N,:) + J(i: N,:) \times \nabla_w a_i$
7. end
8. $\nabla_w h(w,u) \leftarrow H$

IX. Criteria for Selection of the AMGN Algorithm Above BPTT

In this section we will briefly discuss the performance of BP, and algorithm 10, applied to nonlinear adaptive problems.

It has been shown [12] that the steepest-descent method is $H^\infty$—optimal for linear prediction problems, and that BP—we use the term BP to include BPTT for dynamic networks—is locally $H^\infty$—optimal for multi-layered nonlinear prediction problems. In essence, this optimality means that the ratio from the second norm of the disturbance in equ (1), $$\sum_{n=1}^{N} v_n^2,$$

to the second norm of the filtered error, $$\sum_{n=1}^{N} e_{f_n}^2,$$

can be made arbitrarily close to 1.0 for any $\{v_n\}$ as $N \to \infty$, by selecting an initial set of weights close enough to the ideal value. These results explain the superior robustness of BP for nonlinear applications, and linear applications with non-Gaussian disturbances. However, this optimality result for BP applies to scenarios where a new set of inputs is presented to a filter, thus changing cost as a function of the weights, at each training epoch. In this case, the nonlinear modeling error at each training session is treated by BP as an unknown disturbance. This approach to training would occur, for example, in nonlinear prediction applications in which processing speed is limited. It is worth noting that in these scenarios, where parameters are updated according to the error of each newly predicted datum, the matrix (14) will have rank 1. Consequently, the update according to AMGN would be in the same direction as that of BP. In fact, in this situation, Gauss-Newton learning is simply a normalized least squares algorithm, which is $H^\infty$—optimal for a posteriori error for linear problems [9]. In many nonlinear applications however, multiple weight updates are performed using the same set of inputs. In these cases, the performance of BP and AMGN become clearly distinguishable.

We will clearly illustrate the different algorithms' characteristics by transferring our considerations to a simple two-dimensional parameter-space. Consider the simple static network of FIG. (4). Assume that the desired values for the two weights 17 are $w_1=1$, $w_2=1$, so that the desired output 18 of the network is $y_n = u_n + u_n^2$. We select a vector of inputs 19 $[1\ 2\ 3]^T$ so that the desired vector of outputs is $[2\ 6\ 12]^T$. FIG. (5) displays the performance over 100 training epochs of both BP (shown as x) and AMGN (shown as o). For the purpose of comparison, the learning rate was adjusted so that the initial steps taken by both algorithms were of the same magnitude. The learning rate was then adjusted according to the successive augmentation and reduction rule. Notice that AMGN is very close after a few updates. By contrast, BP finds itself stuck at $w_1$=0.84, $w_2$=1.41. This non-stationary limit point occurs since the cost improvement at each update is not substantial enough to achieve convergence. This type of trap for steepest descent algorithms is typical of dynamic networks involving polynomial nonlinearities, or volterra architectures. Note that if we set a lower bound on the learning rate then BP will eventually converge to the point (1,1), but it would take a very large number of updates! This point is illustrated in FIG. (6) where we have imposed a constant step size restriction, 0.1, on both algorithms. Notice the directions of the steps taken as the algorithms approach the global minimum.

X. Examples of Taylor-made Adaptive Dynamic Nonlinear Filters

In this section, we describe two sample applications of the AMGN algorithm and illustrate how one may Taylor-make a network to perform a specific nonlinear dynamic operation, such network being efficiently trained with the new algorithm. Consider the tracking system displayed in FIG. 7. This system can be considered as some nonlinear sensor 20, feeding electronics with nonlinear components 21 and dynamics 22, which output to some plant 23. The dynamics on the feedback path 24 could represent parasitic capacitance in the system. For this example, we choose the dynamic transfer functions and nonlinearities according to:

$$C_1(s) = \frac{s+300}{s+700} \quad (43)$$

$$C_2(s) = \frac{100}{s}$$

$$C_3(s) = \frac{1000}{s+1000}$$

$$f_1(u) = u + \frac{1}{2}u^2 + \frac{1}{3}u^3$$

$$f_2(u) = \arcsin(u)$$

Ideally, we would like the system outputs to exactly track system inputs, however, with nonlinearities, dynamics and feedback, the outputs are a severely distorted version of the original system inputs. We seek an adaptive filter for the purpose of identifying the original system inputs 25 from the system outputs 26, in other words for inverting the system of FIG. 7.

The most general technique in prior art for modeling nonlinear systems with decaying memory, such as FIG. 7, is via a Volterra series. Consider, for example, a nonlinear system which one models with a memory of M taps, and with a nonlinear expansion order of V. The output of the system in response to an input sequence $\{u_n\}$ can then be expressed as the Volterra expansion:

$$y_n = \sum_{k_{1,1}=1}^{M} h_{k_{1,1}} u_{n-k_{1,1}} + \qquad (44)$$

$$\sum_{k_{2,1}=1}^{M} \sum_{k_{2,2}=1}^{M} h_{k_{2,1}} h_{k_{2,2}} u_{n-k_{2,1}} u_{n-k_{2,2}} + \dots \sum_{k_{V,1}=1}^{M} \dots$$

$$\sum_{k_{V,V}=1}^{M} h_{k_{V,1}} \dots h_{k_{V,V}} u_{n-k_{V,1}} \dots u_{n-k_{V,V}}$$

The multi-dimensional sequences specified by h in the expansion are termed Volterra kernels. Each component of a kernel is a coefficient—or weight—for one term in the expansion, and each of these weights must be trained in order to model a system. A network architecture as in FIG. 2 which contains polynomial nonlinearities 3 and embedded linear filters 2, has substantially fewer parameters than would be required in a Volterra series expansion of a similar system. More precisely, the number of Volterra series terms necessary to emulate a single FIR filter of M taps feeding a polynomial GSLN of order V is $$\sum_{n=1}^{V} \left( \sum_{i_{M-2}=1}^{n+1} \sum_{i_{M-3}=1}^{i_{M-2}} \dots \sum_{i_1=1}^{i_2} i_1 \right).$$

To emulate the operation of a multi-layered filter as in FIG. 2, the number of terms required in a Volterra series would increase very rapidly! In general, networks are less able to generalize from training data as the degrees of freedom associated with the network parameter-space increase.

Therefore, if one knows roughly how the system one seeks to emulate is decomposed to static nonlinear blocks and dynamic linear components, one can Taylor-make a filter of the form of FIG. 2 to perform the required processing with a limited number of parameters. A polynomial-based GSLN, where the functions $f_1 \dots f_V$ are simply ascending powers of the input, can model the truncated Taylor series expansion of differentiable functions. Consequently, with few parameters, it can emulate accurately a wide range of static nonlinearities. Therefore, based on an estimate of the time constants of the linear dynamics to be emulated, and an estimate of the order to the nonlinear functions to be emulated, we can Taylor-make a, network for inverting the system of FIG. 7 as shown in FIG. 8. One skilled in the art will recognize that this architecture is based on a block by block inversion of the tracking system.

The acquisition of the training data for this network is described in FIG. 9. We obtain the desired network output, $\{y_n\}$ 27 by sampling 36 the original inputs 28 to the tracking system 29. Sampling 37 the output 30 of the tracking system 29 creates the training inputs sequence $\{u_n\}$ 31 for the network of FIG. 8. The objectives in creating the training signal 28 are two-fold. First, the nonlinearities 20,22 must be excited over the full domain of operation. This is achieved with a chirp signal 32 which starts at frequency 0 and ramps to a frequency beyond the bandwidth of the tracking system 29, and which has an amplitude larger than those encountered during regular tracking. Secondly, in order to improve the condition of the matrix (14), the signal must have significant frequency content near to the Nyquist rate, $1/2T_s$. We achieve this by adding 34 zero-mean white Gaussian noise 33 to the chirp signal 32, which we then input to a zero-order hold 35 with a hold time three times that of the sampling rate, $T_s$. Notice also the factor-of-3 upsamplers on the network paths 38 in FIG. 8. Used in conjunction with a 3-period zero-order-hold 35 in preparation of the training input 31, the upsampling enables an FIR filter 39 to estimate accurately the Euler derivative [13] of a signal which has high frequency content. In brief, every third point of $\{y_n\}$ has a well defined gradient; the rest of the calculated gradients are discarded. The unit delay 40 after sampling 36 the desired output shown in FIG. (9) aligns the training data 27 for the non-causal Euler differentiation. This technique can also be used to implement steepest-descent high-pass filters and pure differentiators.

Training sequences of 1000 data points, sampled at 1 kHz, were used. FIG. (10) shows the RMS network error for 100 parameter updates using the AMGN algorithm, and 200 updates respectively using optimization algorithms known in the art as the Kalman Filter, the Gauss-Newton technique, the BFGS algorithm with a line search [10], and BPTT. The Kalman filter is presented as a standard; the measurement noise and initial covariance were empirically chosen to maximally reduce cost after 200 epochs. For the Gauss-Newton Algorithm, reduced order inverses were formed when matrix (14) was ill-conditioned. The line search for BFGS was conducted using the method of false position [14]. Notice that all Newton-like techniques outperform BPTT. The superior convergence rate and cost minimization achieved with BFGS and AMGN are clearly evident. Note that in contrast to BFGS, AMGN doesn't require a line search so each epoch involves substantially less computation than is required for a BFGS update. FIG. (11) shows the learning rate $\mu_k$ over 100 updates for AMGN. Note that the learning rate increases geometrically until the poor conditioning of matrix (14) significantly distorts the update direction. While it is difficult to establish that the weights converge to a global minimum, one can show that the tracking system dynamics have been captured accurately. This is evidenced in FIG. (12), where the trained weight 41 vector $[w_1^{1,2} \ldots w_{30}^{1,2}]$ emulates the impulse response of a system with dominant pole at 300 rad/sec.

A sum of sinusoids test reference signal was injected into the tracking system. When the system outputs are injected into the trained network, the resultant output error is shown in FIG. 13 (right), together with the error which arises from an exact inversion of all the linear dynamics of the system (left). This indicates the extent to which the nonlinear distortion of the signal has been corrected.

The second example involves the identification and inversion of a Wiener-Type Nonlinear System. The Wiener model applies to an audio amplifier which exhibits crossover distortion. The network architecture employed is displayed in FIG. 14. The memoryless nonlinearity at the amplifier's output is emulated with a parameterized function 42 which can accurately emulate crossover distortion:

$$f(\bar{y}_n, x_1, x_2, x_3) = x_1 \frac{1 + e^{100 x_2 \bar{y}_n}}{1 - e^{100 x_2 \bar{y}_n}} + x_3 \bar{y}_n \qquad (45)$$

The linear dynamics of the amplifier are estimated over the audible band with an IIR digital filter 43. The network training data is gathered according to the method of FIG. 15. The amplifier 47 is excited with a chirp signal 49 ranging in frequency from 19.2–0 kHz, summed 50 with zero-mean Gaussian noise 48. The amplifier outputs 52 are sampled 51 to obtain the desired network output sequence 46. The network input sequence 45 is obtained by sampling 54 the input signal 53. The AMGN algorithm is then used to identify the parameters of the filter in FIG. 14.

It is known in the art that a non-minimum phase zero cannot be precisely dynamically compensated, since it will cause an unstable pole in the compensator. Consequently, if the identification yields a non-minimum-phase zero for the linear filter 43, the output sequence 46 is delayed 55 relative to the input sequence 45 and the identification is repeated. For input sequence 45 $\{u_n\}$, the filter is trained to estimate outputs 46 $\{y_{n-1}\}$. Successive delays may be added until the zeros of the identified linear filter 43 are minimum-phase. Once the filter parameters are identified, the linear 43 and nonlinear blocks 42 are analytically inverted using techniques well known in the art. A lowpass digital filter with cutoff at roughly 20 kHz is appended to the IIR filter inverse to limit high-frequency gain; and a lookup table is used to emulate the inverse of the memoryless nonlinearity. An audio signal is pre-warped by the inverse nonlinearity and then the inverse linear dynamics before being input to the amplifier. The A–D and D–A conversions can be performed with an AD1847 Codec, and the pre-warping of the audio signal can be performed with an ADSP2181 microprocessor. FIG. 16 shows the spectral response of the nonlinear amplifier when excited with a dual tone test signal. FIG. 17 displays the spectral response of the amplifier to a pre-warped dual tone. Note that the amplitudes of nonlinear distortion harmonics have been reduced in the pre-warped signal by more than 20 dB.

These examples are intended only as illustrations of the use of the invention; they do not in any way suggest a limited scope for its application.

REFERENCES

[1] S. D. Sterns, *Adaptive Signal Processing*, Prentice Hall, 1985.

[2] D. K. Frerichs et al., "U.S. patent: Method and procedure for neural control of dynamic processes", Technical Report U.S. Pat. No. 5,175,678, U.S. Patent and Trademark Office, December 1992.

[3] A. Mathur, "U.S. patent: Method for process system identification using neural networks", Technical Report U.S. Pat. No. 5,740,324, U.S. Patent and Trademark Office, April 1998.

[4] D. C. Hyland, "U.S. patent: Multiprocessor system and method for identification and adaptive control of dynamic systems", Technical Report U.S. Pat. No. 5,796,920, U.S. Patent and Trademark Office, August 1998.

[5] S. A. White et al., "U.S. patent: Nonlinear adaptive filter", Technical Report U.S. Pat. No. 4,843,583, U.S. Patent and Trademark Office, June 1989.

[6] D. H. Nguyen, *Applications of Neural Networks in Adaptive Control*, PhD thesis, Stanford University, June 1991.

[7] D. M. Hanks, "U.S. patent: Adaptive feedback system for controlling head/arm position in a disk drive", Technical Report U.S. Pat. No. 5,548,192, U.S. Patent and Trademark Office, August 1996.

[8] A. Back et al., "A unifying view of some training algorithms for multilayer perceptrons with fir filter synapses", *Proceedings of the 1994 IEEE Workshop on Neural Networks for Signal Processing*, vol. 1, pp. 146–154, 1994.

[9] B. Hassibi, "h$^\infty$ optimality of the lms algorithm", *IEEE transaction on Signal Processing*, vol. 44, no. 2, pp. 267–280, February 1996.

[10] D. P. Bertsekas, *Nonlinear Programming*, vol. 1, Athena Scientific, 2nd edition, 1995.

[11] N. Wiener, *Nonlinear Problems in Random Theory*, Wiley, New-York, 1958.

[12] B. Hassibi, "h$^\infty$ optimal training algorithms and their relation to backpropagation", *Proceedings of the NIPS94—Neural Information Processing Systems: Natural and Synthetic*, pp. 191–198, November-December 1994.

[13] G. F. Franklin, *Digital Control of Dynamic Systems*, Addison-Wesley, 2nd edition, 1990.

[14] D. G. Luenberger, *Linear and Nonlinear Programming*, Addison-Wesley, 2nd edition, 1984.

What is claimed is:

1. A method for training a dynamic nonlinear adaptive filter with embedded memory, the method comprising:
   a) propagating a training sequence through the dynamic nonlinear adaptive filter to obtain an output sequence, where the filter is represented by a filter architecture h and a set of filter parameters w, and where the filter architecture h comprises adaptable static nonlinear components and adaptable linear components;
   b) constructing a matrix $\nabla h_w$ from filter architecture h, from the set of filter parameters w, and from an error sequence, where the matrix $\nabla h_w$ relates each parameter of w to an error produced by the parameter over all components of the error sequence, where the error sequence measures a difference between the output sequence and a desired output sequence; and
   c) updating the filter parameters w based on a learning rate, current (and possibly past) parameter vectors w, current (and possibly past) matrices $\nabla h_w$, and current (and possibly past) error sequences, where an update direction is closer to a Newton update direction than that of a steepest descent method.

2. The method of claim 1 wherein updating the filter parameter w is achieved with a modified Gauss-Newton optimization technique which uses only the current parameter vector w, the current matrix $\nabla h_w$, the current error sequence, and where the update direction and an update magnitude are determined by the learning rate.

3. The method of claim 1 wherein constructing the matrix $\nabla h_w$ comprises repeated convolutions with time-varying gains at various layers of the filter.

4. The method of claim 1 wherein constructing the matrix $\nabla h_w$ comprises repeated matrix multiplications that account for a dependence of filter output on all prior states within the filter.

5. The method of claim 1 wherein updating the filter parameters w comprises:
   propagating the training sequence through the filter to obtain a temporary output sequence, where a temporary set of filter parameters $w_t$ is used during the propagating;
   evaluating a cost function J depending on the error sequence; evaluating a temporary cost function $J_t$ depending on a temporary error sequence, where the temporary error sequence measures a difference between the temporary output sequence and the desired output sequence;
   setting $w=w_t$ and increasing the learning rate if $J > J_t$,
   decreasing the learning rate and repeating the parameter update if $J \leq J_t$.

6. The method of claim 1 wherein the filter architecture h comprises adaptable static nonlinear components and adaptable linear components.

7. The method of claim 1 wherein (a) through (c) are repeated with training signals selected to excite an entire domain of operation of the nonlinear components, and to excite an entire operational bandwidth of the linear components.

8. The method of claim 1 further comprising delaying the training sequence relative to the output sequence, whereby the filter may be trained to implement a non-causal Euler derivative in mapping from the outputs to the inputs.

9. The method of claim 1 further comprising delaying the output sequence relative to the training sequence, whereby the filter may be trained to implement a minimum-phase model of a dynamic system.

10. A method for training a dynamic nonlinear adaptive filter, the method comprising:
    a) propagating a training sequence through the dynamic nonlinear adaptive filter to obtain an output sequence, where the filter is represented by a filter architecture h and a set of filter parameters w;
    b) constructing a matrix $\nabla h_w$ from filter architecture h, from the set of filter parameters w, and from an error sequence, where the error sequence measures a difference between the output sequence and a desired output sequence; and
    c) determining an update vector $\Delta w$ from matrix $\nabla h_w$, from the error sequence, and from a learning rate, where both a magnitude and a direction of update vector $\Delta w$ depends on a value of the learning rate; and
    d) updating the filter parameters w based on the update vector $\Delta w$.

11. The method of claim 10 wherein the direction of the update vector $\Delta w$ is closer to the Newton update direction than that of a steepest-descent method.

12. The method of claim 10 wherein the matrix $\nabla h_w$ relates each of the parameters in w to an error produced by that parameter over all components of the error sequence.

13. The method of claim 10 wherein the filter architecture h comprises adaptable static nonlinear components and adaptable linear components.

14. The method of claim 10 wherein updating the filter parameters w comprises:
    propagating the training sequence through the filter to obtain a temporary output sequence, where a temporary set of filter parameters $w_t$ is used during the propagating;
    evaluating a cost function J depending on the error sequence;
    evaluating a temporary cost function $J_t$ depending on a temporary error sequence, where the temporary error sequence measures a difference between the temporary output sequence and the desired output sequence;
    setting $w=w_t$ and increasing the learning rate if $J > J_t$,
    decreasing the learning rate and repeating the parameter update if $J \leq J_t$.

15. The method of claim 10 wherein (a) through (d) are repeated with training sequences selected to excite an entire domain of operation of the nonlinear components, and to excite an entire operational bandwidth of the linear components.

16. The method of claim 10 further comprising delaying the training sequence relative to the output sequence, whereby the filter may be trained to implement a non-causal Euler derivative in mapping from the outputs to the inputs.

17. The method of claim 10 further comprising delaying the output sequence relative to the training sequence, whereby the filter may be trained to implement a minimum-phase model of a dynamic system.

18. A dynamic nonlinear adaptive filter with embedded memory comprising:
    a) a plurality of adjustable linear filter blocks;
    b) a plurality of adjustable nonlinear filter blocks;
    c) a filter training circuit; and
    wherein the linear and nonlinear filter blocks are interconnected to form a network;

wherein the linear and nonlinear filter blocks comprise memory for storing filter parameters;

wherein the filter training circuit updates the filter parameters using a method with parameter updates closer to a Newton update direction than those of a steepest descent method, and which comprises comparing a desired filter output sequence with an actual filter output sequence resulting from a filter training sequence propagated through the filter; and wherein updating the filter parameter w is achieved with a modified Gauss-Newton optimization technique for which the update direction and magnitude are determined by a learning rate.

19. The filter of claim 18 wherein the filter training circuit calculates a matrix $\nabla h_w$ relating each of the filter parameters to an error produced by the parameter over all components of an error sequence, where the error sequence measures a difference between the output sequence and the desired output sequence.

20. The filter of claim 18 wherein the conditioning of the matrix inverse performed in calculating an update vector $\Delta w$ is determined by the learning rate.

21. The filter of claim 18 wherein the filter training circuit selects training sequences to excite an entire domain of operation of the nonlinear blocks, and to excite an entire operational bandwidth of the linear blocks.

22. A nonlinear filter system comprising:

a) a nonlinear filter comprising a plurality of linear filter blocks embedded in a plurality of nonlinear filter blocks, wherein the filter comprises a memory for storing filter parameters; and b) a filter training circuit for updating the filter parameters, wherein the circuit compares a desired filter output sequence with an actual filter output sequence resulting from a filter training sequence propagated through the filter, and the circuit implements a filter parameter update with a direction closer to a Newton update direction than that of a steepest descent method;

wherein the training circuit selects a plurality of training sequences to excite an entire domain of operation of the nonlinear blocks, and to excite an entire operational bandwidth of the linear blocks.

23. The system of claim 22 wherein the training circuit calculates a matrix $\nabla h_w$ relating each of the filter parameters to an error produced by that parameter over all components of an error sequence, where the error sequence measures a difference between the output sequence and the desired output sequence.

24. The system of claim 22 wherein updating the filter parameter w is achieved with a modified Gauss-Newton optimization technique for which an update direction and magnitude are determined by a learning rate.

25. The system of claim 24 wherein a conditioning of the matrix inverse performed in determining the update is determined by the learning rate.

* * * * *